(12) United States Patent
Leibsohn

(10) Patent No.: US 8,891,801 B1
(45) Date of Patent: Nov. 18, 2014

(54) PRENATAL SOUND DEVICE

(76) Inventor: Julianne Hope Leibsohn, Great Neck, NY (US)

( * ) Notice: Subject to any disclaimer, the term of this patent is extended or adjusted under 35 U.S.C. 154(b) by 0 days.

(21) Appl. No.: 13/398,101

(22) Filed: Feb. 16, 2012

Related U.S. Application Data

(60) Provisional application No. 61/443,498, filed on Feb. 16, 2011.

(51) Int. Cl.
H04R 25/00 (2006.01)
(52) U.S. Cl.
USPC .............................. 381/385; 381/301; 381/333
(58) Field of Classification Search
USPC ......... 381/301, 309, 332, 333, 334, 385, 386, 381/388, 60, 328, 380; 2/338; 224/240, 224/910; 600/27
See application file for complete search history.

(56) References Cited

U.S. PATENT DOCUMENTS

| 4,934,998 A * | 6/1990 | Thomas, Jr. ..................... 600/27 |
| 5,109,421 A * | 4/1992 | Fox ................................. 381/333 |
| 6,154,546 A * | 11/2000 | Uvacek ............................ 381/60 |
| 2009/0274323 A1 * | 11/2009 | Godart ........................... 381/109 |

* cited by examiner

Primary Examiner — Huyen D Le
(74) Attorney, Agent, or Firm — Fish & Richardson P.C.

(57) ABSTRACT

An audio attenuation device for attenuating audio for transmission to an unborn baby includes a body and an attachment mechanism for attaching the body to an article of clothing of an expectant mother. The body is configured to receive at least one audio earbud that includes an audio producing side from which an audio signal is transmitted from the earbud. The body further includes a layer of material configured to be positioned in contact with the audio producing side to receive the audio signal from the earbud and to attenuate an intensity of the audio signal. The layer of material is configured such that, when the audio signal that is received by the layer of material has a maximum sound level of approximately 90 decibels or greater, the attenuated audio signal exiting the layer of material has a maximum sound level between approximately 45 and 85 decibels.

20 Claims, 25 Drawing Sheets

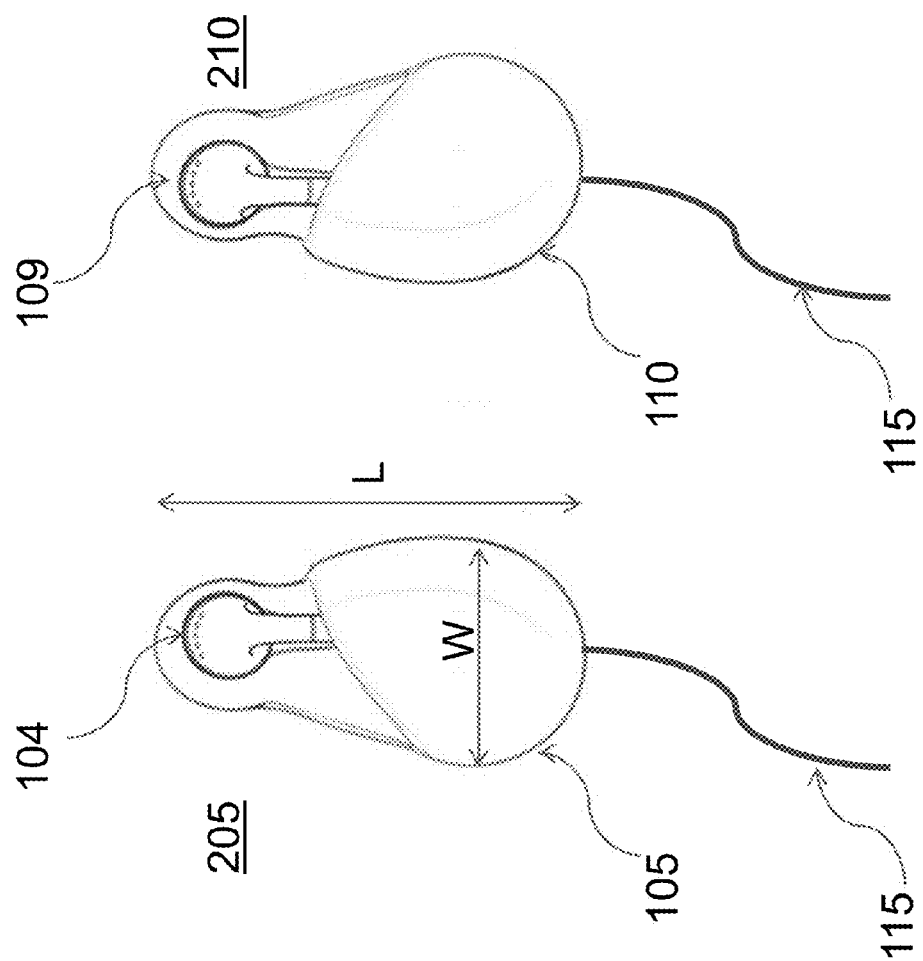

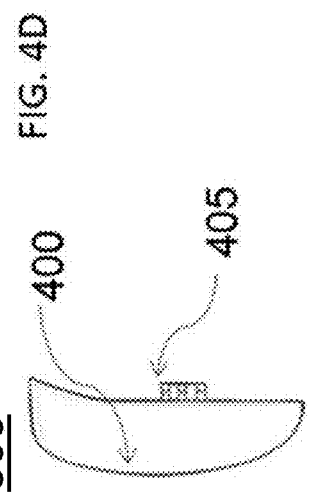
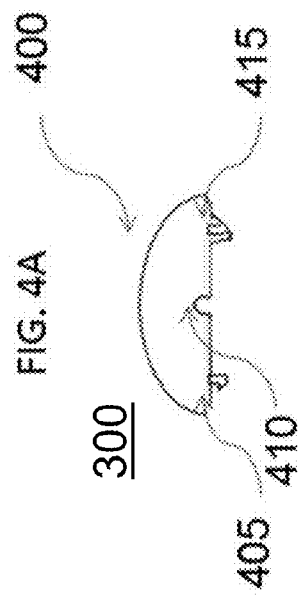
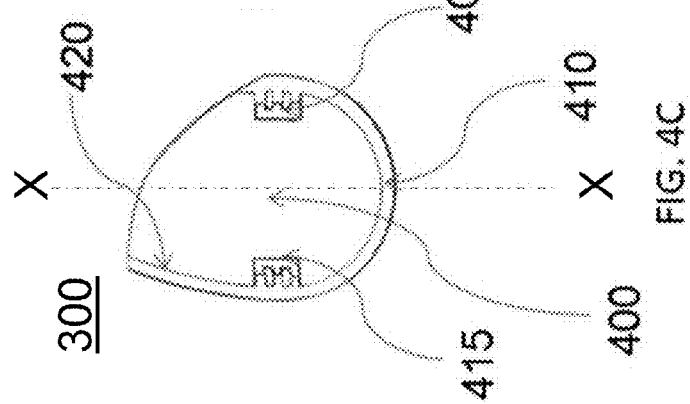
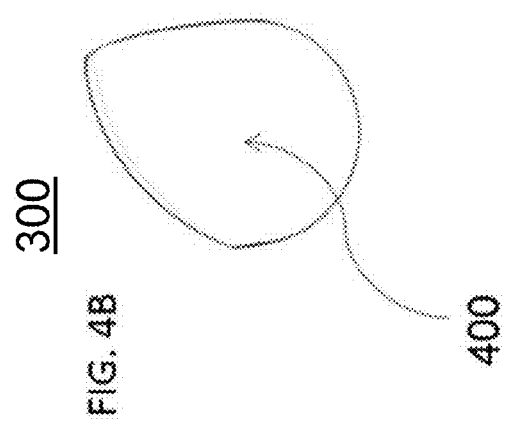

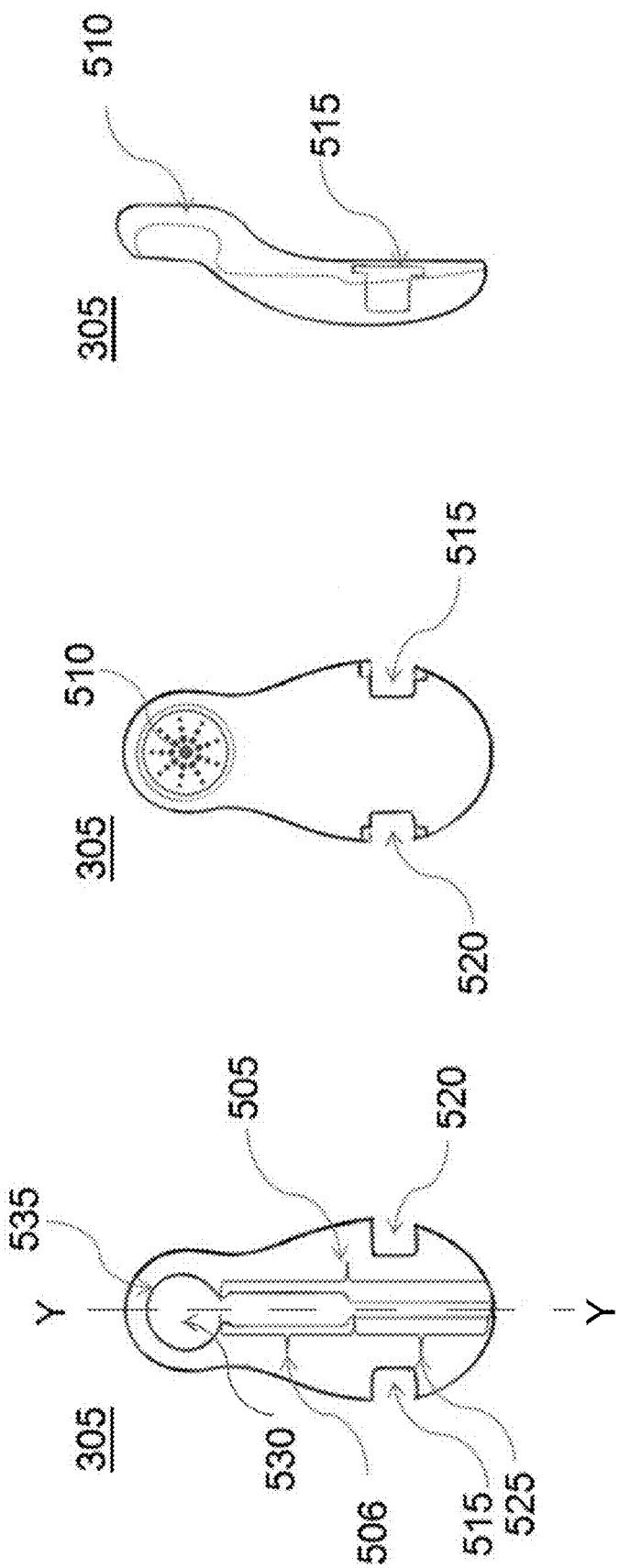

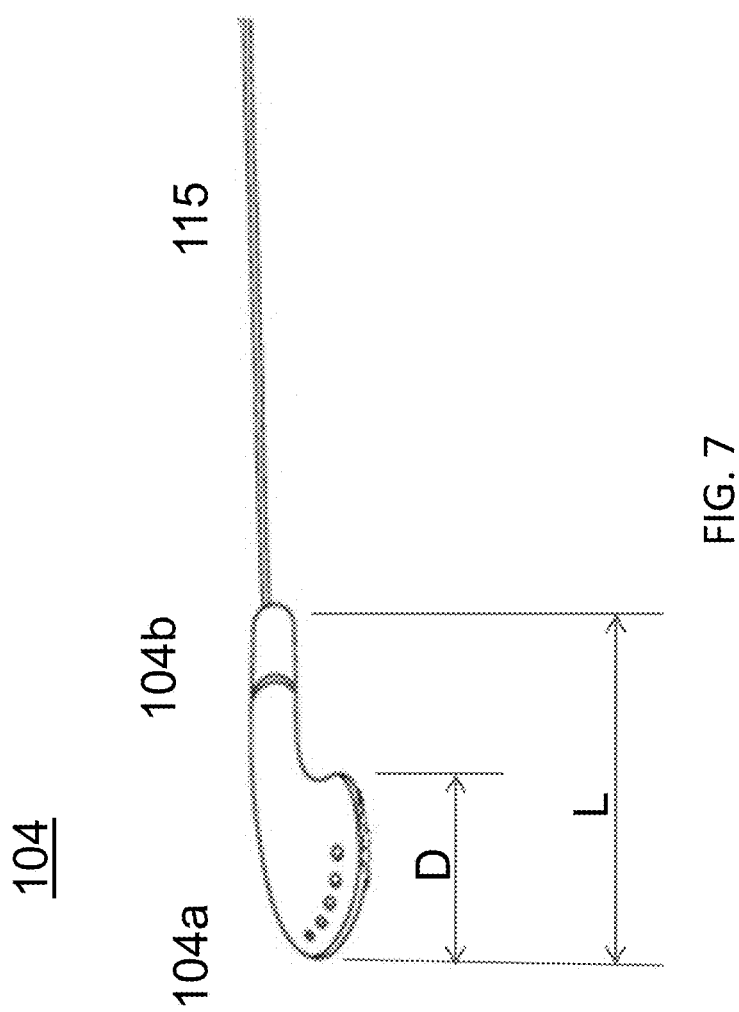

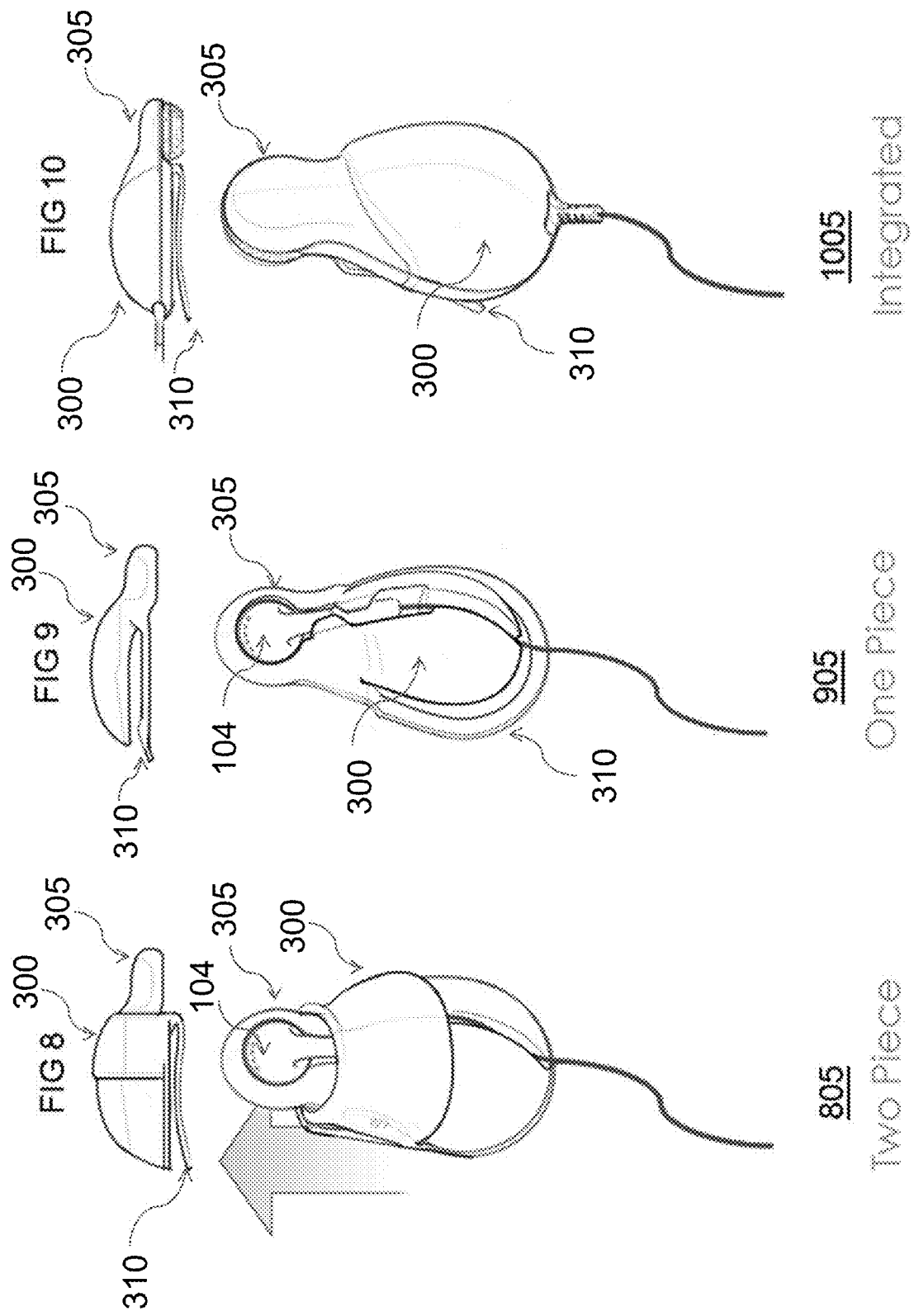

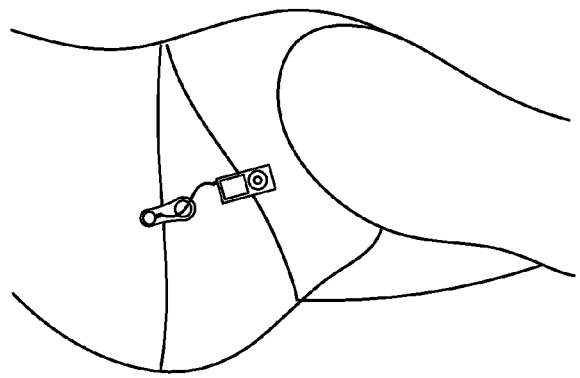
FIG. 13
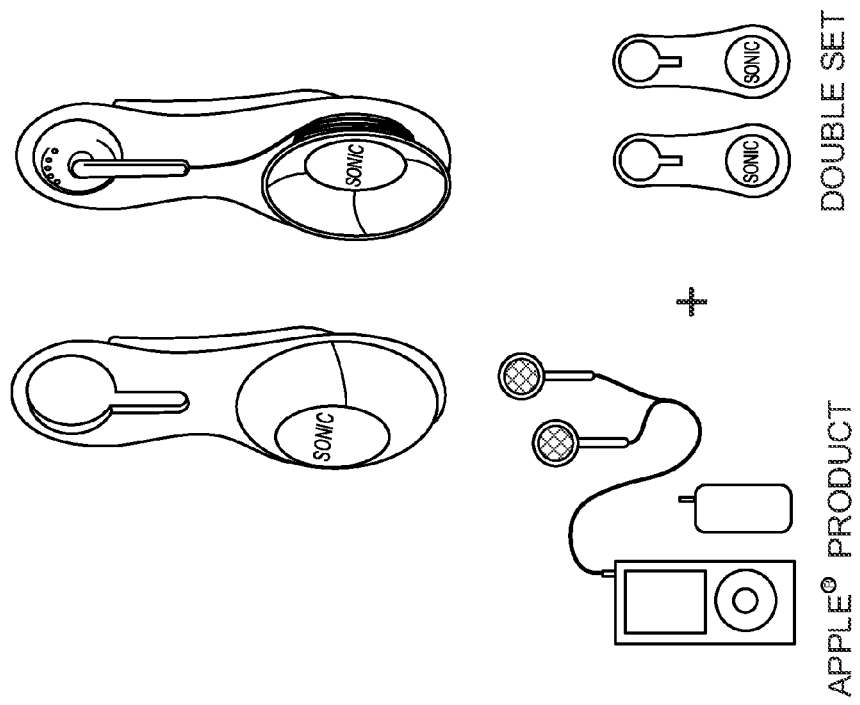

US 8,891,801 B1

PRENATAL SOUND DEVICE

CROSS-REFERENCE TO RELATED APPLICATION

This application claims priority from U.S. Provisional Application Ser. No. 61/443,498, filed on Feb. 16, 2011 and titled PRENATAL SOUND DEVICE, which is incorporated herein by reference for all purposes.

TECHNICAL FIELD

This disclosure relates to techniques for providing sound to fetuses.

BACKGROUND

Recent research has shown that unborn babies (fetuses) have the ability to hear sound while still in the womb. An unborn baby may also recognize and react to certain sounds such as music, the mother's and/or father's voice, and a variety of other natural and/or man-made sounds. More specifically, research has indicated that fetus hearing ability begins to develop at approximately 16 to 18 weeks. Sensitivity to a broad range of frequencies in the audible range (from 20 Hz to 20000 Hz) progressively improves throughout the pregnancy. The playing of sounds and music to fetuses may have a variety of beneficial effects including: intellectual or cognitive development, stimulation, relaxation, parent child bonding and helping to turn babies who are breech into the correct position before birth. Newborn infants continue to respond to music played to them while in the womb. A familiar piece of music may have a calming effect after birth.

SUMMARY

In one example implementation, a prenatal sound device transmits sounds and/or music to an unborn baby in the mother's womb via one or two audio earplugs maintained in close proximity to the surface of the abdomen. The earplugs are held in place by an assembly that includes, among other features: (i) a clip for attaching the unit to an article of clothing, such as a pant or skirt waistband, bellyband, tank-top, belt or bra, and (ii) a thin layer of material that attenuates the volume of the sound from the audio ear plug to safe levels for the fetus. The prenatal sound device differs from typical techniques, which provide prenatal sound by: (1) attenuating the volume of the sound through use of in-line signal processing via software and/or hardware; and/or (2) using a pair of loudspeakers rather than a pair of earbuds as the audio output device.

The details of one or more implementations are set forth in the accompanying drawings and the description below. Other features and objects will be apparent from the description and drawings, and from the claims.

BRIEF DESCRIPTION OF DRAWINGS

FIGS. 2A and 2B are drawings of swaddles in which are positioned earbuds.

FIG. 4A is a drawing of a swaddle front cover viewed from the underneath when used in the orientation shown in FIG. 1A.

FIG. 4B is a drawing of a swaddle front cover viewed from the outside.

FIG. 4C is a drawing of a swaddle front cover viewed from the inside.

FIG. 4D is a drawing of a swaddle front cover viewed from the right, when used in the orientation shown in FIG. 1A.

FIG. 5A is a drawing of an audio attenuating earbud holder viewed from the outside FIG. 5B is a drawing of an audio attenuating earbud holder viewed from the inside FIG. 5C is a drawing of an audio attenuating earbud holder viewed from the right, when used in the orientation shown in FIG. 1A.

FIG. 7 is a drawing of a commercially available audio earbud.

FIG. 8 is a drawing of a swaddle having a front cover and a back cover integrally formed.

FIG. 9 is a drawing of a swaddle having a front cover, an audio attenuating earbud holder, and a back cover integrally formed.

FIG. 10 is a drawing of a swaddle having a front cover, an audio attenuating earbud holder, an earbud and a back cover integrally formed.

FIGS. 11-20 are drawings of different implementations of prenatal sound systems.

Like reference symbols in the various drawings indicate like elements.

DETAILED DESCRIPTION

Figure 1A:
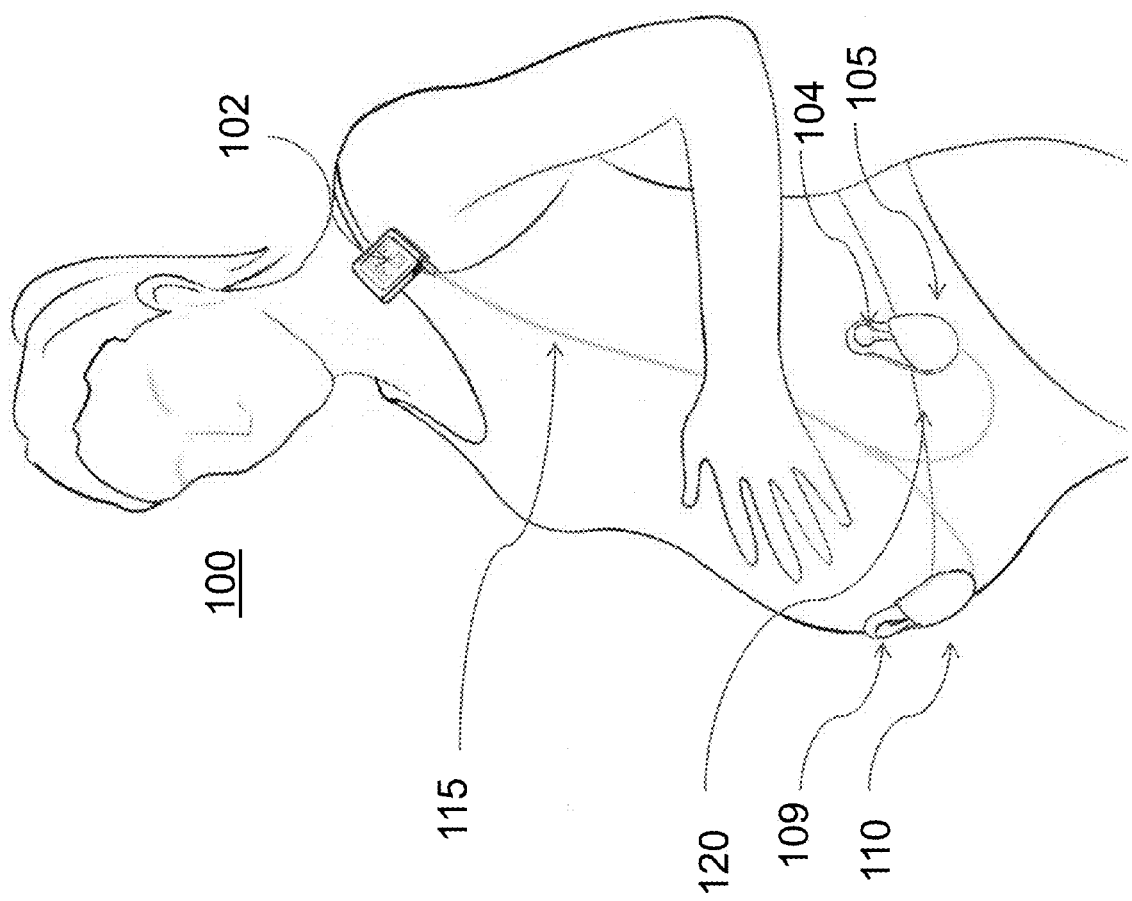
FIG. 1A is a drawing of a prenatal sound system using two commercially available audio earbuds held in proximity to the abdomen by a pair of swaddles clipped on to a waistband.

As shown in FIG. 1A, a prenatal sound system 100 includes a portable audio player 102 connected via an audio cable 115 to a first earbud 104 positioned in a first swaddle 105 and to a second earbud 109 positioned in a second swaddle 110. The term "swaddle" is used herein to reference an attenuating earbud holder device. Example implementations of the first swaddle 105 and the second swaddle 110 are described in further detail below. The portable audio player 102 may be, for example, an Apple IPOD® and may include a clip or other attachment mechanism to enable the portable audio player 102 to be attached to an expectant mother or her clothing. IPOD® is a registered trademark of Apple, Inc. located in Cupertino, Calif. The audio cable 115 enables audio to be communicated from the portable audio player 102 to the first and second earbuds 104 and 109. FIG. 7 shows an example of an earbud 104 that includes an earbud head 104a connected to an earbud neck 104b that receives the audio cable 115. The earbud 104 is configured to be inserted into an ear and may be a standard commercially available earbud for use with a standard commercially available portable audio player. In one implementation example, the earbud 104 may have a diameter D of approximately 5/8 inches and a length L of approximately 1 AND 3/8 inches. The audio cable may be, for example, a 43 inch long, standard 32 AWG audio cable fixedly attached to the earbud 104.

In the implementation depicted in FIG. 1A, the first swaddle 105 and the second swaddle 110 are attached to a waistband 120 around the waist of an expectant mother. As described in more detail below, the first swaddle 105 and the second swaddle 110 are configured to attenuate sound transmitted from the earbuds 104 and 109 to decibel levels that enable the fetus to hear the sound without risk of injury. For example, a standard portable audio player 102 may transmit sound out of each earbud 104 and 109 that ranges from 30 decibels to a maximum of approximately 115 decibels. A fetus is typically able to safely hear sound in the range of 45-85 decibels, with sounds exceeding 85 decibels in magnitude potentially resulting in injury to the fetus. Accordingly, the first swaddle 105 and the second swaddle 110 may be configured, for example, to attenuate the sounds transmitted from each earbud 104 and 109 by approximately 30 decibels to ensure that the magnitude of the sound output by the earbuds 104 and 109 is reduced to a level that allows the fetus to hear the music without risk of injury. Notably, due to noise pollution constraints, some earbuds may be limited to transmitting sound having a maximum sound level of only 90 decibels.

FIG. 2A depicts an implementation example 205 of a first swaddle 105 in which is positioned an earbud 104 connected to an audio cable 115. The swaddle 205 may, for example, have a length L equal to 2 and 5/8 inches and a width W equal to 1 and 1/2 inches. The second swaddle 110 may be identical in structure to the first swaddle 105 or, alternatively, may have a structure that is the mirror image of the first swaddle 105. For example, FIG. 2B shows an implementation example 210 of a second swaddle 110 that is a mirror image of the first swaddle 205.

Figure 3A:
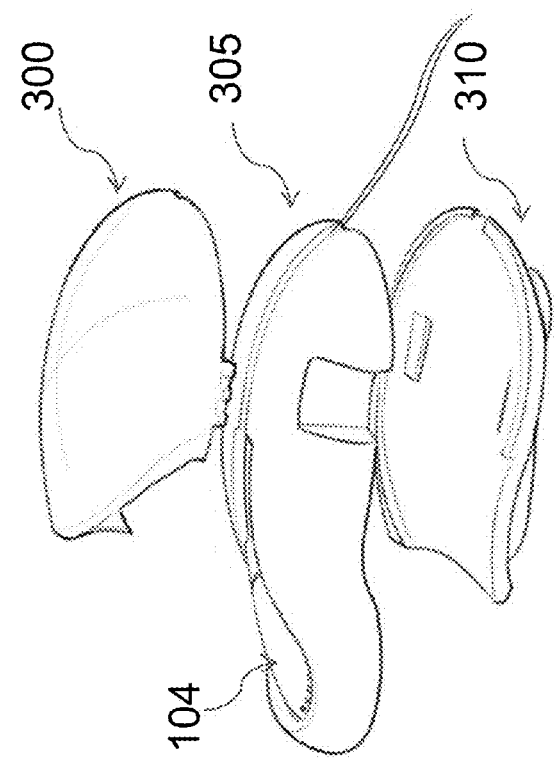
FIG. 3A is an exploded view of a single swaddle.
Figure 3B:
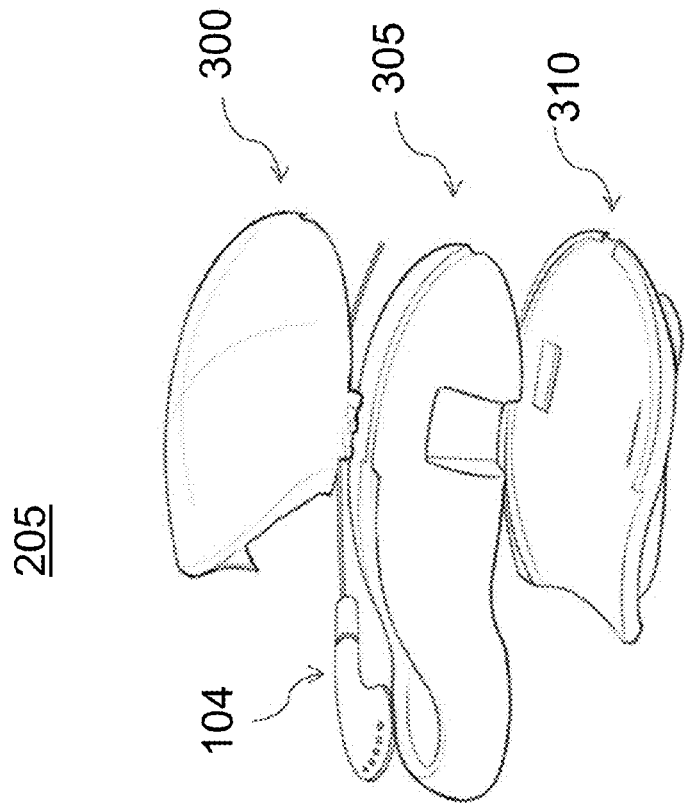
FIG. 3B is a perspective view of a single swaddle in which is positioned an earbud.

FIG. 3A shows an exploded view of the swaddle 205 depicting its main components. As shown in FIG. 3A, the swaddle 205 includes a front cover 300, an audio attenuating earbud holder 305 and a back cover 310. FIG. 3B shows an exploded view of the swaddle 205 in which an earbud 104 and a portion of the audio cable 115 is nestled in the audio attenuating earbud holder 305.

Referring to FIGS. 4A-4D, the front cover 300 may be made of a material, such as, for example, ABS (Acrylonitrile Butadiene Styrene) plastic, that combines sufficient rigidity to keep the audio attenuating earbud holder 305 in place, with sufficient flexibility to enable the user to attach and remove the front cover from the back cover 310.

The front cover 300 includes a cover 400 to keep the audio attenuating earbud holder 305 in place, a notch 410 to allow egress of the audio earbud wire 115 from the swaddle 205 and an attachment mechanism for removably attaching the front cover 300 to the back cover 310. In the implementation example shown in FIGS. 4A-4D, the attachment mechanism is composed of resilient hooks 405 and 415 that extend through slots 515 and 520 of the audio attenuating earbud holder 305 (see FIGS. 5A-5C) and are removably received in holes 605 and 610, respectively, in the back cover 310 (see FIGS. 6A-6C). The hooks 405 and 415 resiliently deform upon insertion into the holes 605 and 610 and then spring back to their non-deformed shape upon egress through the back side of holes 605 and 610, thereby enabling them to hook onto a lip 606 and 612 of the back cover 310 to secure the front cover 300 to the back cover 310. (see FIGS. 6A-6C). The hooks 405 and 415 may be subsequently detached from the back cover to remove the front cover 300 from the back cover 310 by squeezing the sides of the cover 400. The cover 400 is made of resilient material (e.g., ABS plastic) that flexes, causing the hooks 405 and 415 to move laterally towards the central longitudinal axis X of the cover 400 (FIG. 4C) and, thereby, detaching from the lip 606 and 612 of the back cover 310. Other alternative attachment mechanisms that may be used to attach the front cover 300 to the back cover 310 include one or more of a hinge, a living hinge (i.e., a thin flexible hinge (flexure bearing) made from plastic that joins two rigid plastic parts together, allowing them to bend along the line of the hinge), a spring-hinge, a snap-fit on the edge of the front and back covers, a lip on the edge of the front cover that snaps over the back cover, a lip on the edge of the back cover that snaps over the front cover, a sliding mechanism—in which the back cover slides over the front cover or vice versa, a mechanism in which the user squeezes the hooks to detach them, a screw mechanism, magnetic inserts in the front and back cover, and Velcro.

Referring to FIGS. 5A-5C, the earbud holder 305 may be made of a flexible and conformable material, such as, for example, silicone rubber, that has shape memory. The material may be sufficiently flexible to retract as necessary to enable the user to push a head 104a of an audio earbud 104 into an earbud head cavity 530 of the earbud holder 305 and then sufficiently resilient and conformable to snap back to its previous shape while conforming around the audio earbud head 104a to thereby tightly hold it in place in the earbud head cavity 530. That is, the earbud holder 305 may snugly hold the earbud 104 in place by conforming to the shape of the earbud head 104a. In some implementations, the earbud holder 305 is formed of the same material as the front cover 300 and the back cover 310.

Figure 5D:
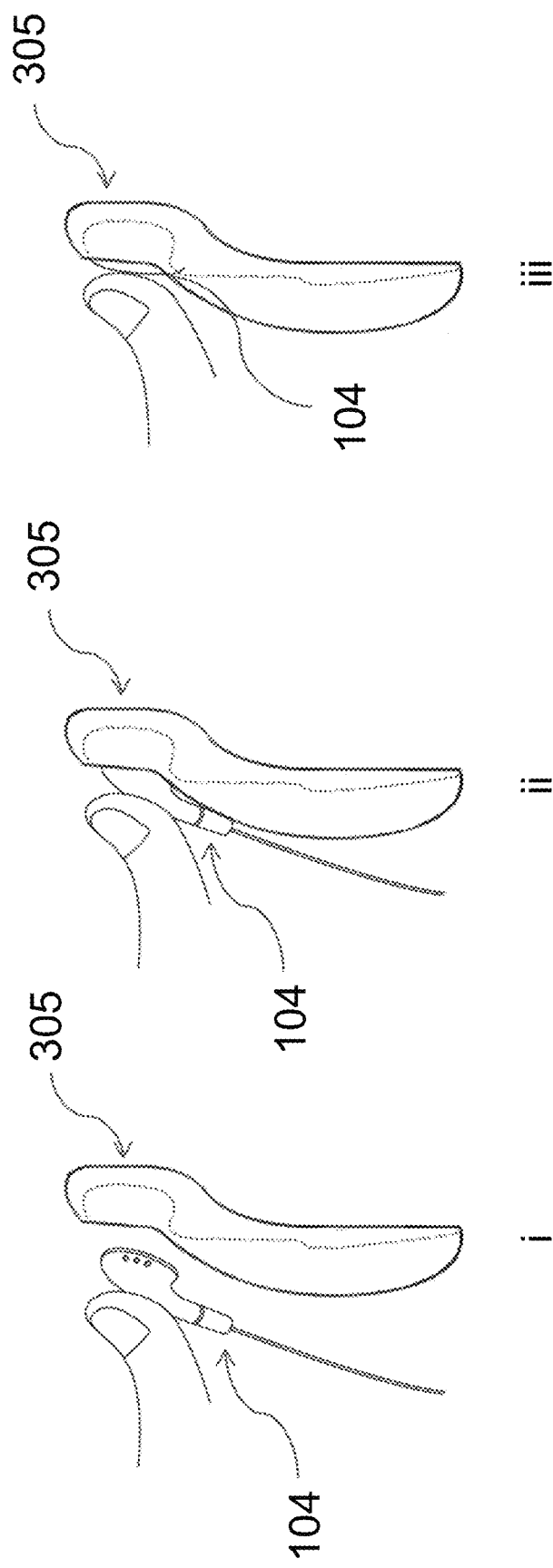
FIG. 5D(i)-(iii) are a sequence of drawings depicting a process for inserting an earbud into an audio attenuating earbud holder.

The audio attenuating earbud holder 305 may include cutouts or slots 515 and 520 through which the hook mechanisms 405 and 415 from the front cover 300 may pass to allow attachment to the back cover 310 as described previously. The earbud holder 305 further includes a circular earbud head cavity 530 into which the earbud head 104a may be inserted, a circular rim 535 of the earbud head cavity configured to hold the earbud head 104a in place, a channel 505 in communication with the head cavity 530 that includes a broad portion 506 configured to hold a neck 104b of the audio earbud 104 and a narrow portion 525 configured to hold the audio cable 115 that extends from the neck 104b. FIG. 5A shows an implementation example in which the channel 505 is positioned along the central longitudinal axis Y of the earbud holder 305. FIG. 5D shows a process for inserting the earbud into the earbud holder 305.

Referring back to FIGS. 5A-5C, the audio attenuating earbud holder 305 further includes an audio attenuation portion 510. The audio attenuation portion 510 is configured to attenuate the intensity of sound transmitted from the earbud head 104a to safe levels for a fetus. In some implementations the audio attenuation portion 510 is a thinned wall positioned at the bottom of the circular earbud head cavity 530. The wall may, for example, cover all or a portion of the area of the earbud head cavity 530. The thinned wall may be made of the same or a different material than that used to make the earbud holder 305. For example, the thinned wall may be made of a section of silicone or similar material and may have a thickness selected to achieve the desired level of attenuation. For example, when made of silicone, the thinned wall may be approximately 3/64 of an inch to provide between 30 dB and 45 dB attenuation, without impacting sound quality. In some implementations, the external surface of the thinned wall may contain markings or indentations in a form (e.g., a grill) which suggests that sound is transmitted through the material from the audio earbud at an attenuated level. Notably, the audio attenuating earbud holder 305 is curved, as shown best in FIG. 5C, such that the audio attenuation portion 510 may be positioned in contact with or otherwise in close proximity to the surface of the abdomen of the expectant mother while still providing sufficient clearance in the portion of the earbud holder 305 in which the slots 515 and 520 are formed for positioning the back cover 310 between the earbud holder 305 and the abdomen of the expectant mother.

Figure 6C:
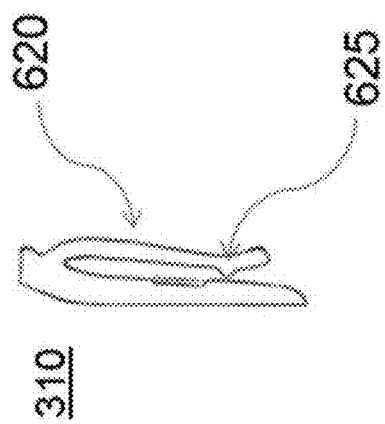
FIG. 6C is a drawing showing a right side of a swaddle back cover, when used in the orientation show in FIG. 1A.
Figure 6B:
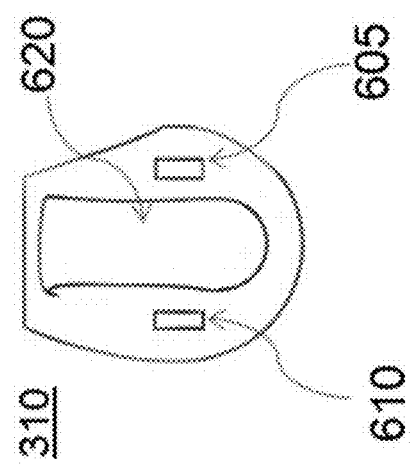
FIG. 6B is a drawing of an outside face of a swaddle back cover, which attaches to clothing and faces towards the abdomen during use.
Figure 6A:
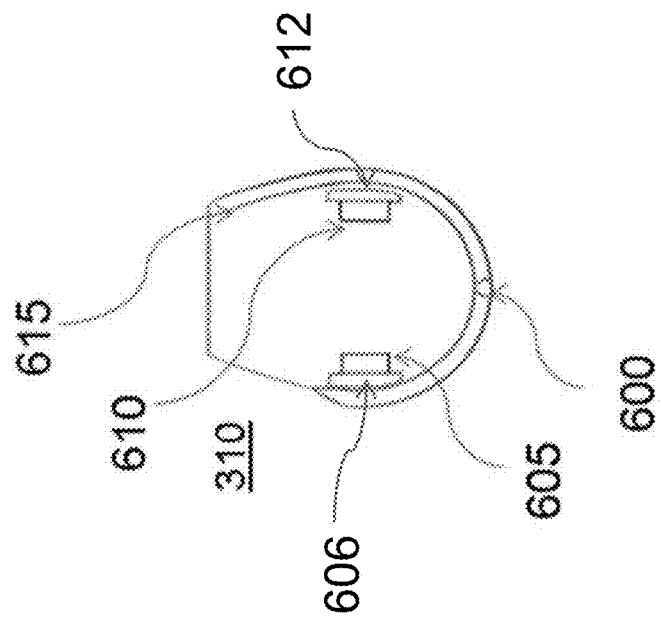
FIG. 6A is a drawing of an inside face of a swaddle back cover, when facing away from the abdomen during use.

Referring to FIGS. 6A-6C, the back cover 310 of the swaddle 205 may be made of a material, such as, for example, ABS plastic, that combines sufficient rigidity to keep the audio attenuating earbud holder 305 and front cover 300 in place, with sufficient springiness to enable a clip 620 to resiliently deflect to thereby fix firmly to an article of clothing. The back cover 310 includes a raised lip 615 that is used to position the audio attenuating earbud holder 305 prior to assembly, and a cover attachment mechanism such as, for example, holes 605 and 610 for attaching the swaddle back cover 310 to the hooks 405 and 415 on the swaddle front cover 300, as described previously. The back cover 310 may further include a notch 600 for egress of the audio earbud wire 115, and a clip 620 for affixing the swaddle 205 to an article of clothing, such as, for example, the waistband 120 or a bra. The clip 620 may include a mechanism such as a ridge 625, for increasing the grip of the clip 620 on the clothing.

In using the prenatal sound system 100, the expectant mother first inserts the head of the audio earbud 104a into the earbud head cavity 530 in the audio attenuating earbud holder 305. The expectant mother then pushes the neck of the earbud 104b into the broad portion 506 of the channel 505 of the audio attenuating earbud holder 305, and pushes the earbud wire 115 into the narrow portion 525 of the channel 505. After completing these steps, the audio earbud head 104a is held firmly in place by the rim 535 of the audio earbud holder 305 and the sound-emitting face of the audio earbud is in contact with the audio attenuation wall or portion 510.

The mother may then place the sub-assembly that includes the audio earbud 104 and the audio attenuating earbud holder 305 into the swaddle back cover 310, such that the edge of the audio earbud holder 305 is held in place by the rim 615 of the swaddle back cover, the earbud wire 115 passes through the notch 600 in the rim, and the cut-outs or slots 515 and 520 are aligned with the holes 605 and 610. The mother then snaps the swaddle front cover 300 on to the sub-assembly that includes the audio earbud 104, the audio attenuating earbud holder 305 and the Swaddle back cover 310. During assembly, the swaddle front cover is aligned with the other components, such that the hooks 405 and 415 pass through the cut-outs 515 and 520 in the audio attenuating earbud holder 305 and then snap into place in the holes 605 and 610 in the swaddle back cover.

Figure 1B:
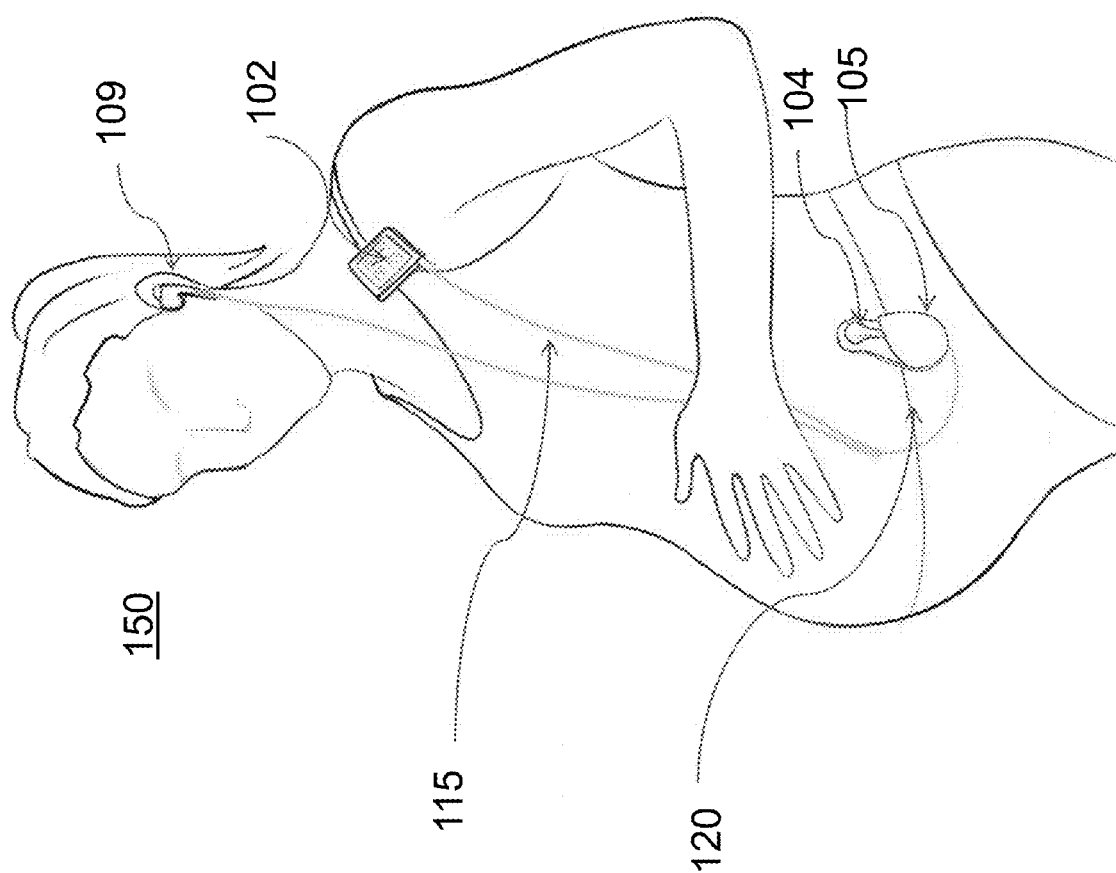
FIG. 1B is a drawing of a prenatal sound system using one commercially available audio earbud held in proximity to the abdomen by a single swaddle, clipped on to a waistband, and in which the mother listens to the same music/audio from a second audio earbud.
Figure 1C:
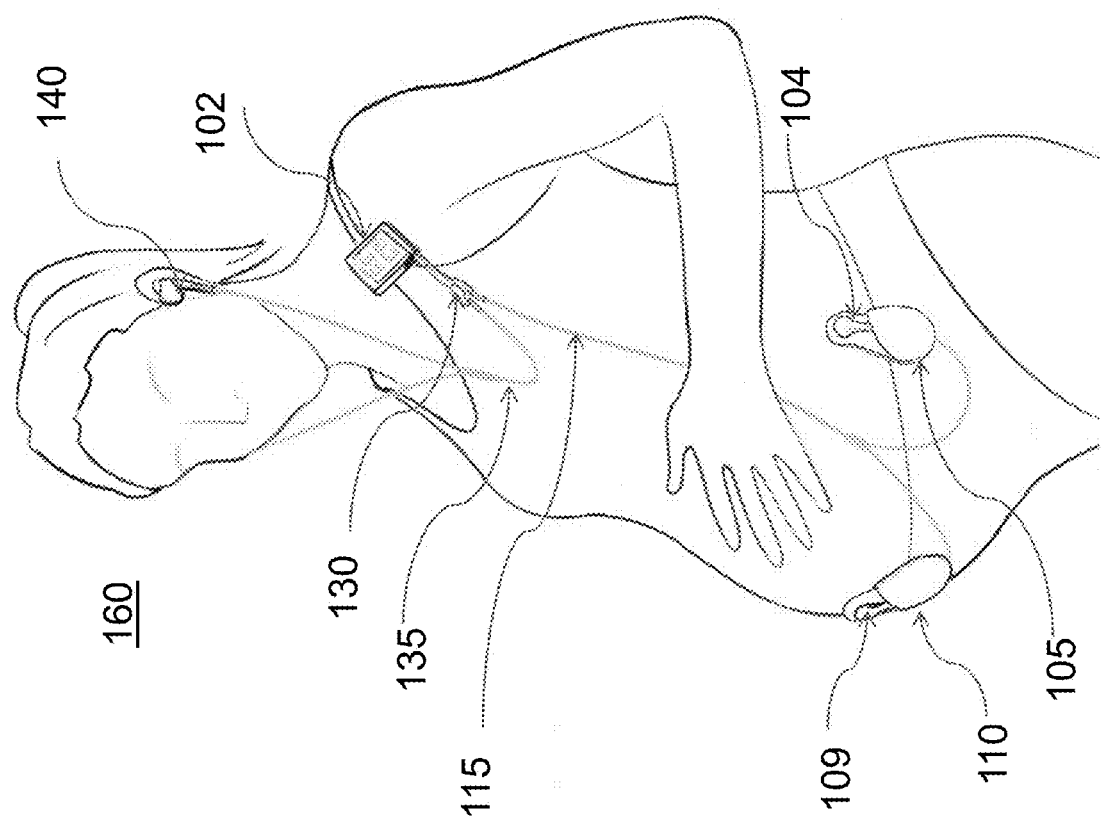
FIG. 1C is a drawing of a prenatal sound system that uses a pair of commercially available audio earbuds held in proximity to the abdomen by a pair of swaddles clipped on to a waistband, and in which the mother listens to the same music from a second pair of audio earbuds.
Figure 1D:
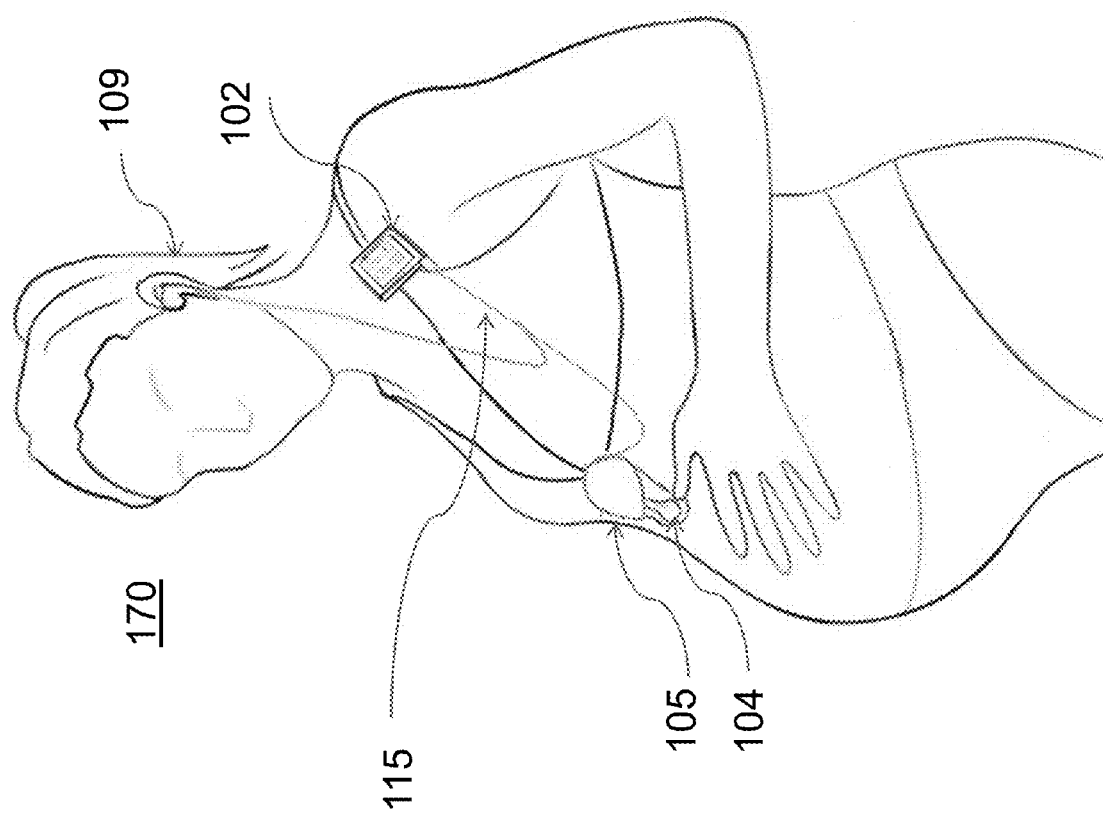
FIG. 1D is a drawing of a prenatal sound system that uses one commercially available audio earbud held in proximity to the abdomen by a single swaddle clipped on to a bra, and in which the mother listens to the same music from a second audio earbud.

Depending on the particular arrangement desired by the mother, the mother may then optionally repeat the process with a second audio earbud 109 and second swaddle 110. In one example arrangement 100 shown in FIG. 1A, the mother then plugs the audio earbud wire 115 into the audio/music player 102. She then clips both assemblies on to an article of clothing, such as the waistband 120 around her pants. In a second example arrangement 150 shown in FIG. 1B, only one earbud 104 (and associated swaddle assembly 105) is used to play music (or, more generally, audio) to the fetus. A second earbud 109 is inserted in the mother's ear to enable her to listen to the music/audio at the same time as the fetus. In a third example arrangement 160 shown in FIG. 1C, both earbuds 104 and 109 are used to play music/audio to the fetus. However, the audio earbud cable 115 is connected to the audio/music player 102 via an audio earbud splitter 130 that allows the audio/music player 102 to additionally provide the audio/music signal to an additional audio cable 135 for communication of the audio/music signal to an earbud or earbuds 140 inserted in one or both of the mother's (or father's) ears A fourth example arrangement 170 shown in FIG. 1D is similar to the audio arrangement 150 shown in FIG. 1B with the exception that the one earbud 104 (and associated swaddle assembly 105) are clipped onto a bra, rather than to a waistband of the mother.

A number of implementations have been described. Nevertheless, it will be understood that various modifications may be made. For instance, in some implementations, the front cover 300 and the back cover 310 of the swaddle 205 are not removably attached to each other but rather are fixedly attached to each other or are integrally formed. For example, the front cover 300 and the back cover 310 may be glued or otherwise bonded together such that removal of the front cover 300 from the back cover 310 would cause damage to the swaddle 205. Alternatively, the front cover 300 and the back cover 310 may be integrally formed as a single molded piece. The front cover 300 and the back cover 310, when fixedly attached to each other or when integrally formed, may removably receive the audio attenuating earbud holder 305 and the earbud 104. An example 805 of the swaddle 205 having the front cover 300 and back cover 310 integrally formed is shown in FIG. 8.

In some implementations, the front cover 300, the earbud holder 305 and the back cover 310 are integrally formed or otherwise fixedly attached to each other to thereby form a single unit that removably receives the earbud 104. An example 905 of the swaddle 205 having the front cover 300, the back cover 310 and the earbud holder 305 integrally formed is shown in FIG. 9

In other implementation, the front cover 300, the earbud holder 305, the back cover 310, the earbud 104 and optionally the audio cable 115 are integrally formed as a single unit. An example 1005 of the swaddle 205 having the front cover 300, back cover 310, earbud holder 305 and the earbud 104 is shown in FIG. 10. For example, the front cover 300 and the back cover 310 may be fixedly connected to each other after insertion of both the earbud holder 305 and the earbud 104 such that removal of the earbud holder 305 and the earbud 104 would require damaging the swaddle 205.

Additional implementations of prenatal sound systems are shown in FIGS. 11 to 20.

Figure 11:
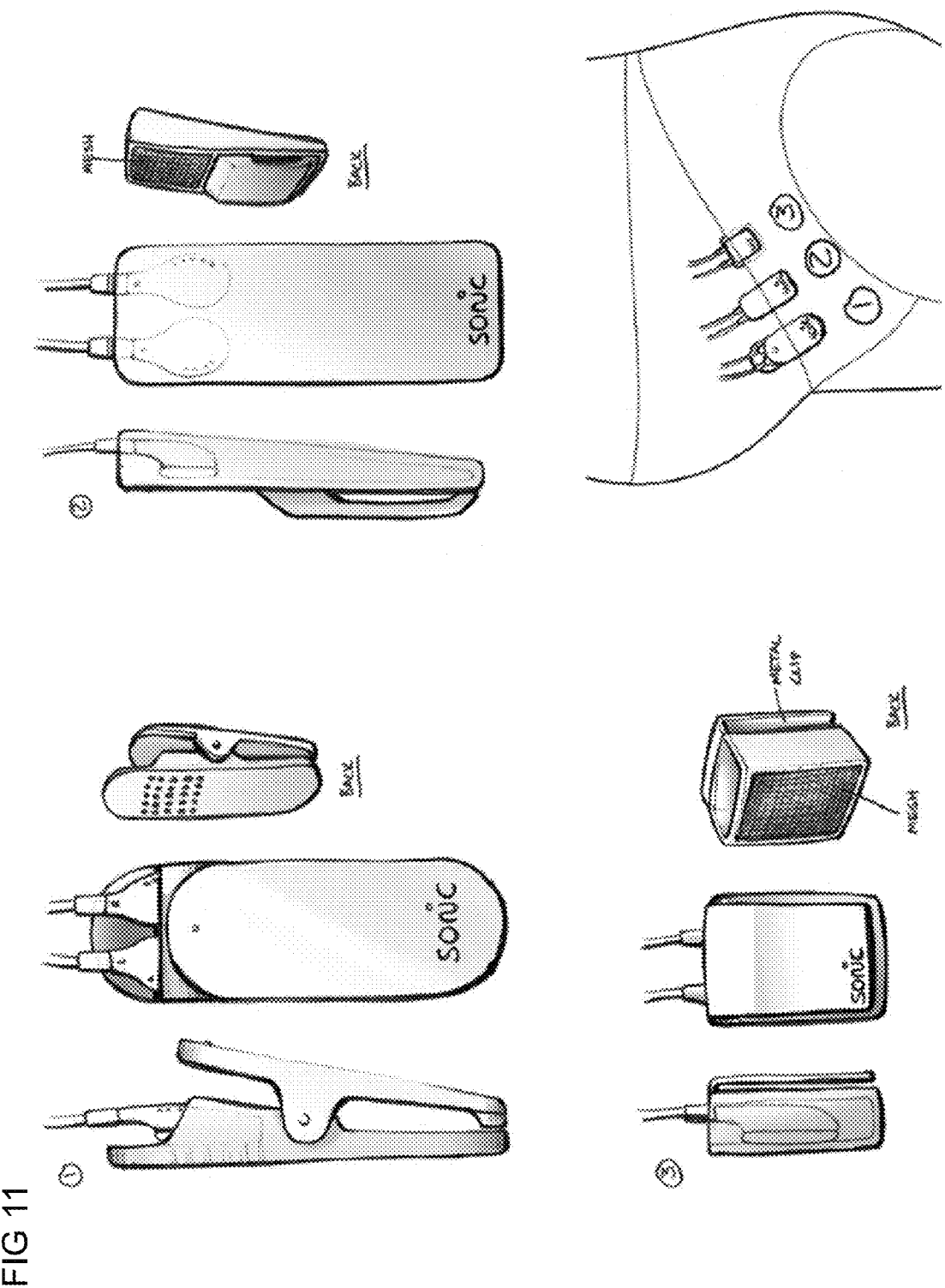

FIG. 11 shows a prenatal sound system that uses a spring-loaded clip. The audio attenuating device is held in place by the clip which affixes to a belt. The two earbuds are attached at the inside surface of the clip, which also acts as a mechanism for audio attenuation.

Figure 12:
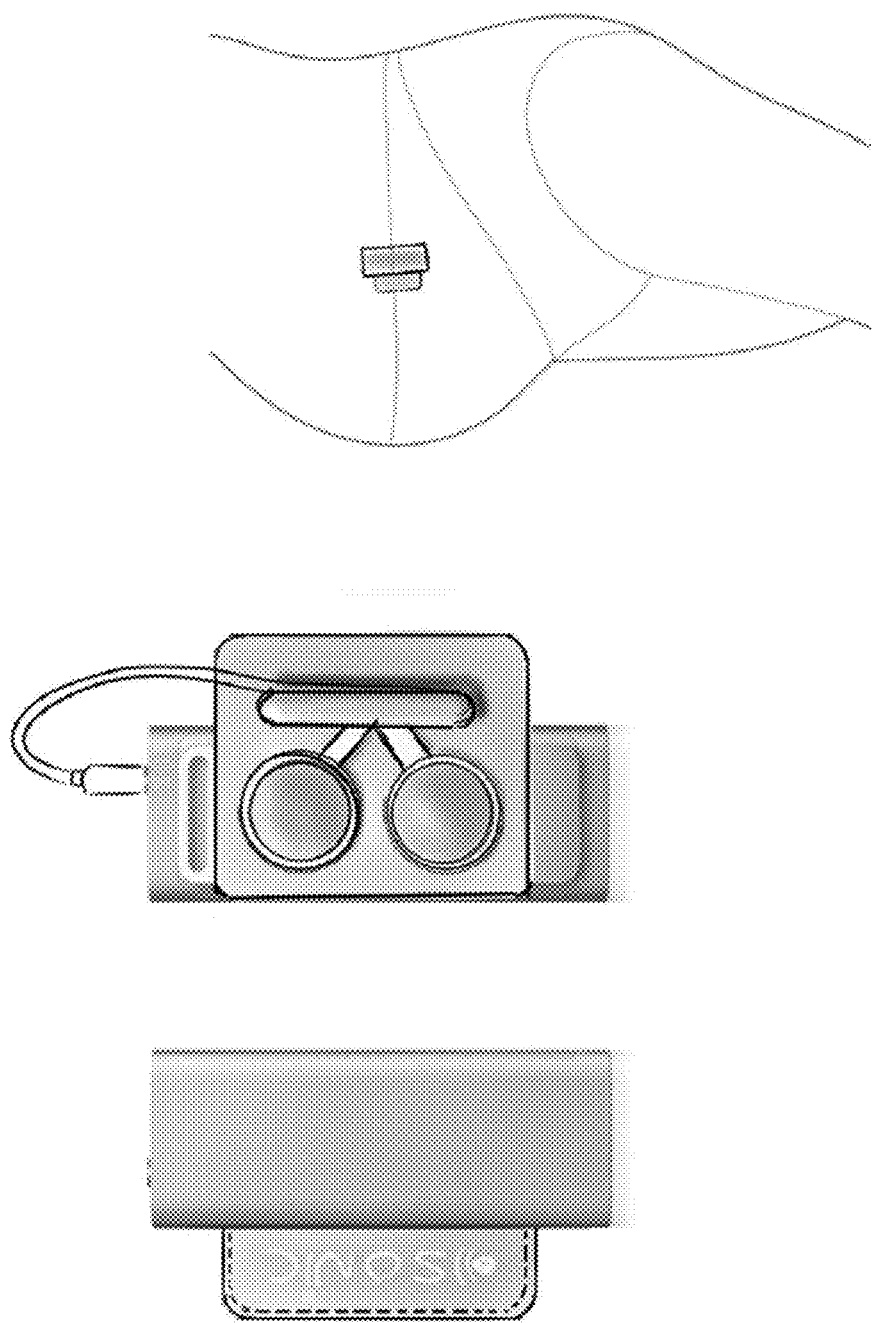

FIG. 12 shows a prenatal sound system that uses an Apple IPOD SHUFFLE®. IPOD SHUFFLE® is a registered trademark of Apple, Inc. The audio attenuation device is held in place by the IPOD SHUFFLE® clip, which affixes to a belt. The two earbuds are attached to the inside surface of the device, which also acts as a mechanism for audio attenuation.

FIG. 13 shows a prenatal sound system that includes a mechanism for stowing the earbud cable, by wrapping it around a bobbin.

Figure 14:
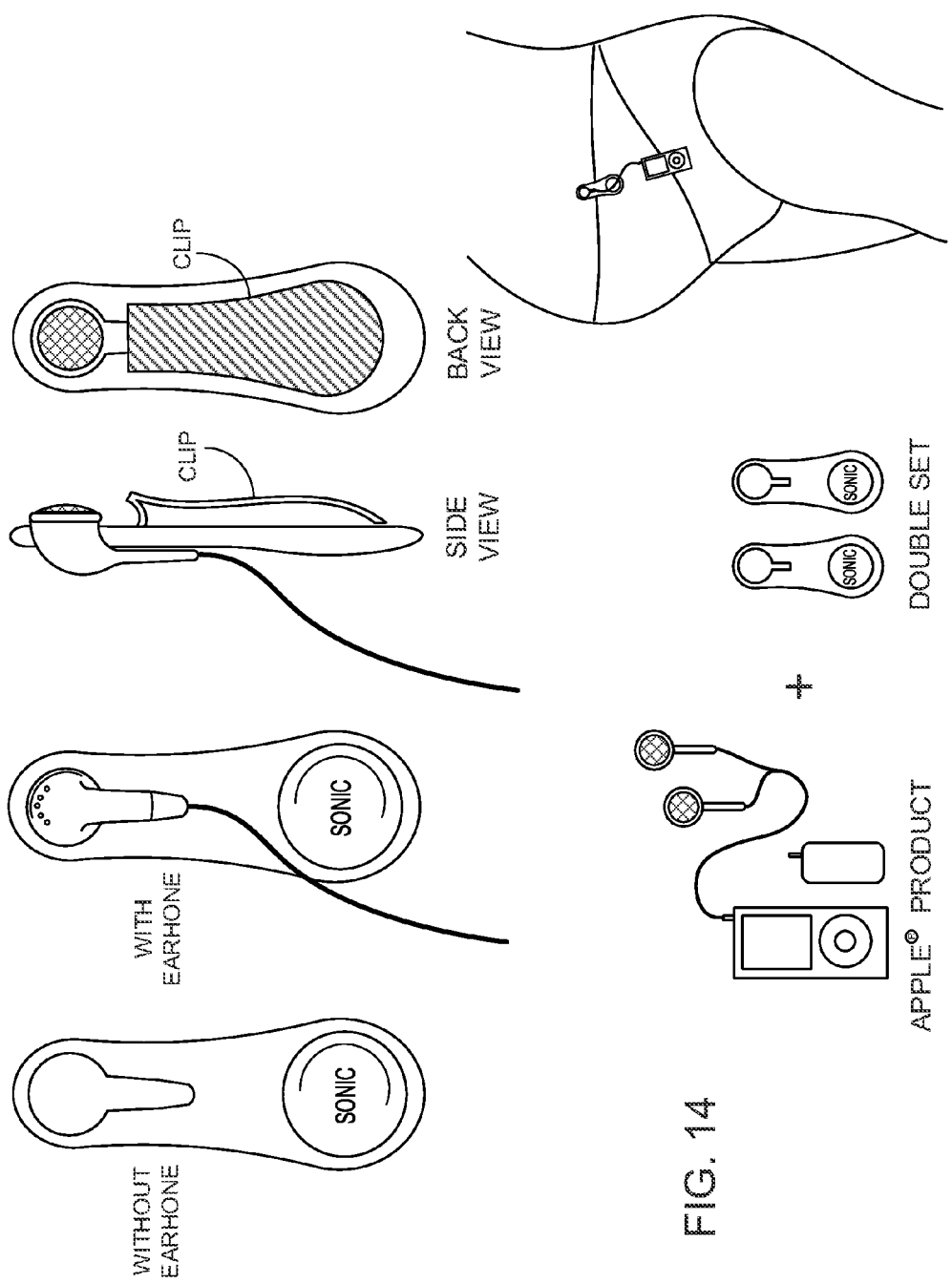

FIG. 14 shows a prenatal sound system without a mechanism for audio attenuation. In the system depicted in FIG. 13, the earbud is placed through a hole in the device, which then holds the earbud to the abdomen.

Figure 15:
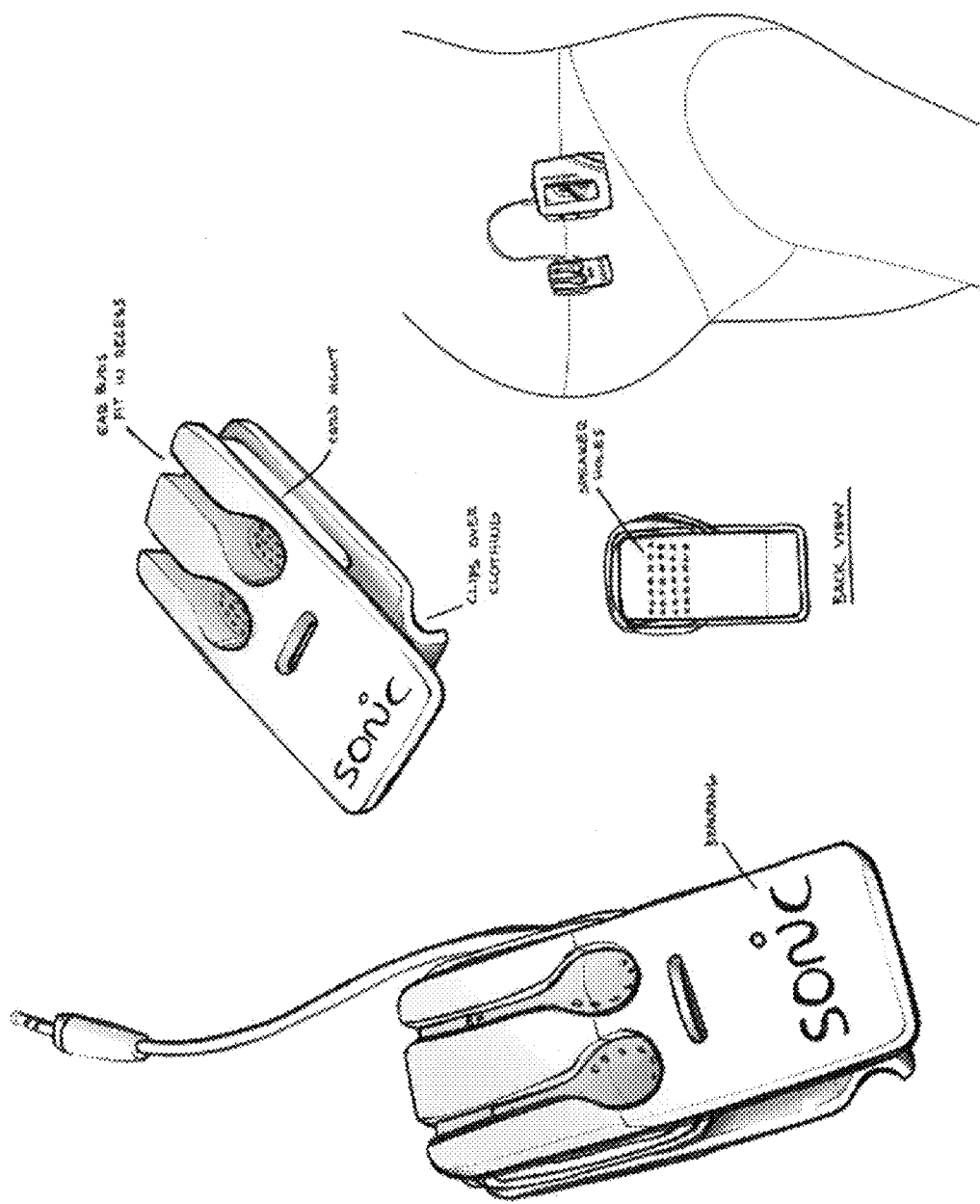

FIG. 15 shows a prenatal sound system that includes a mechanism for clipping the device to clothing, a mechanism for stowing cable and a mechanism for holding one or both earbuds in proximity to the abdomen. The audio attenuation can be provided by a thin layer of material (e.g. silicone rubber) or an air gap.

Figure 16:
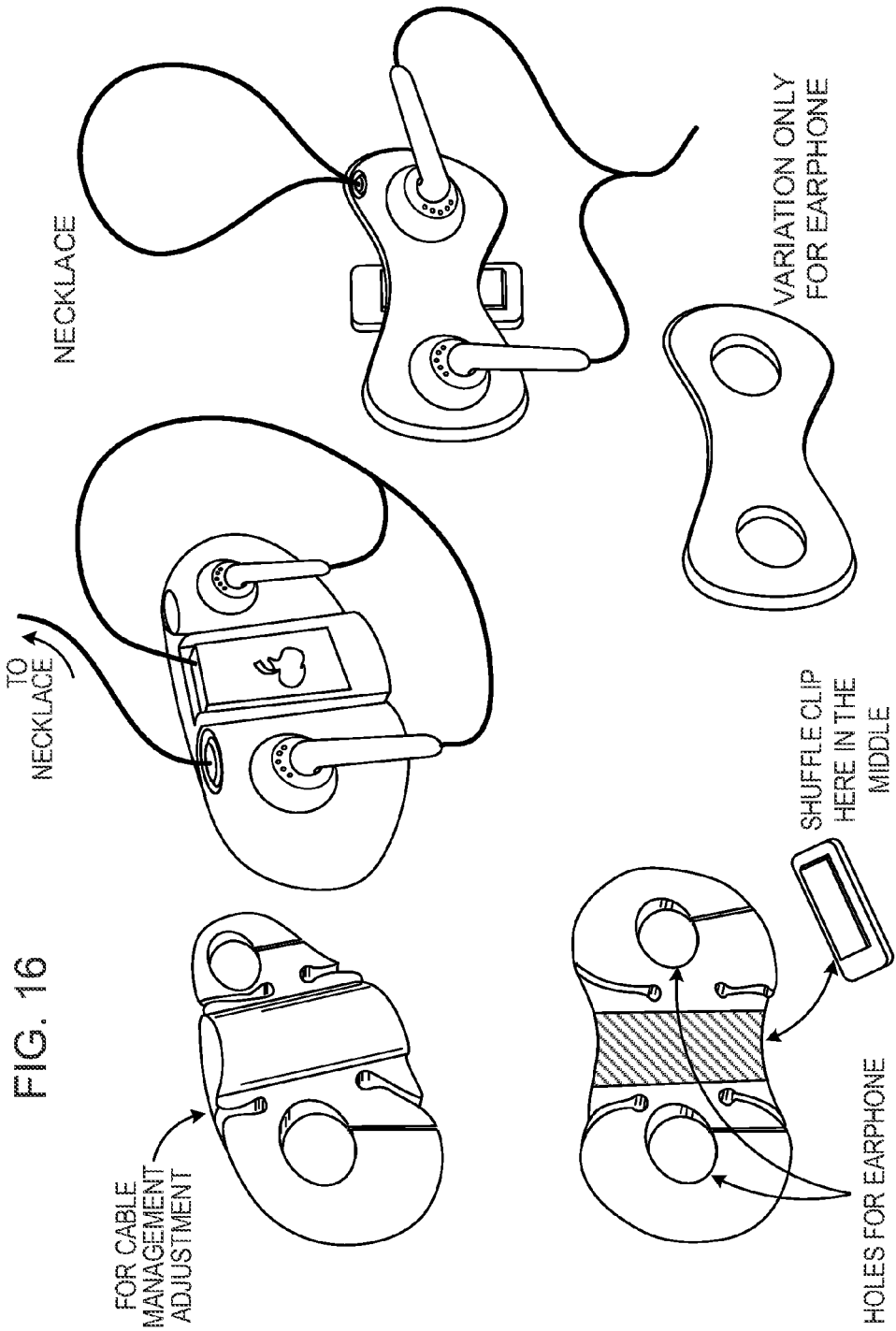

FIG. 16 shows a prenatal sound system in which an Apple IPOD SHUFFLE® is clipped on to the centerpiece of a device, shaped like a butterfly, which hangs on a lanyard around the neck. The "wing-shaped" elements of the design provide a mechanism for affixing the earbuds to the device, holding the earbuds in close proximity to the abdomen and a mechanism for providing audio attenuation.

Figure 17:
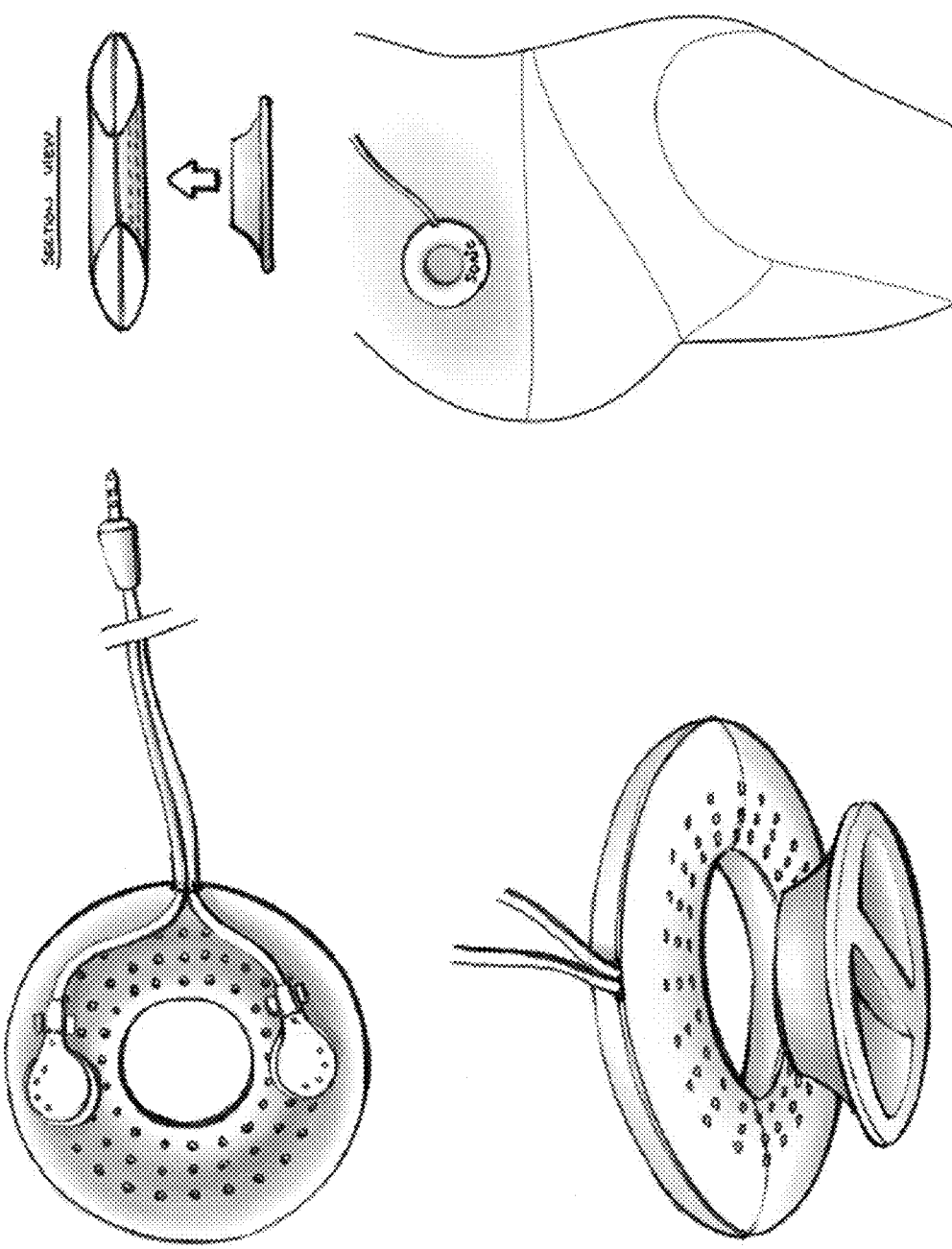

FIG. 17 shows a prenatal sound system in which the audio attenuation device is affixed to clothing by means of a ring shaped component, and a plug. The ring is held on one side of an item of clothing. The plug is held on the other side of the clothing and then pushed into the center of the ring. The plug clips into the ring by means of a push or a snap fit. The ring also provides a mechanism for holding the earbuds and for providing audio attenuation.

Figure 18:
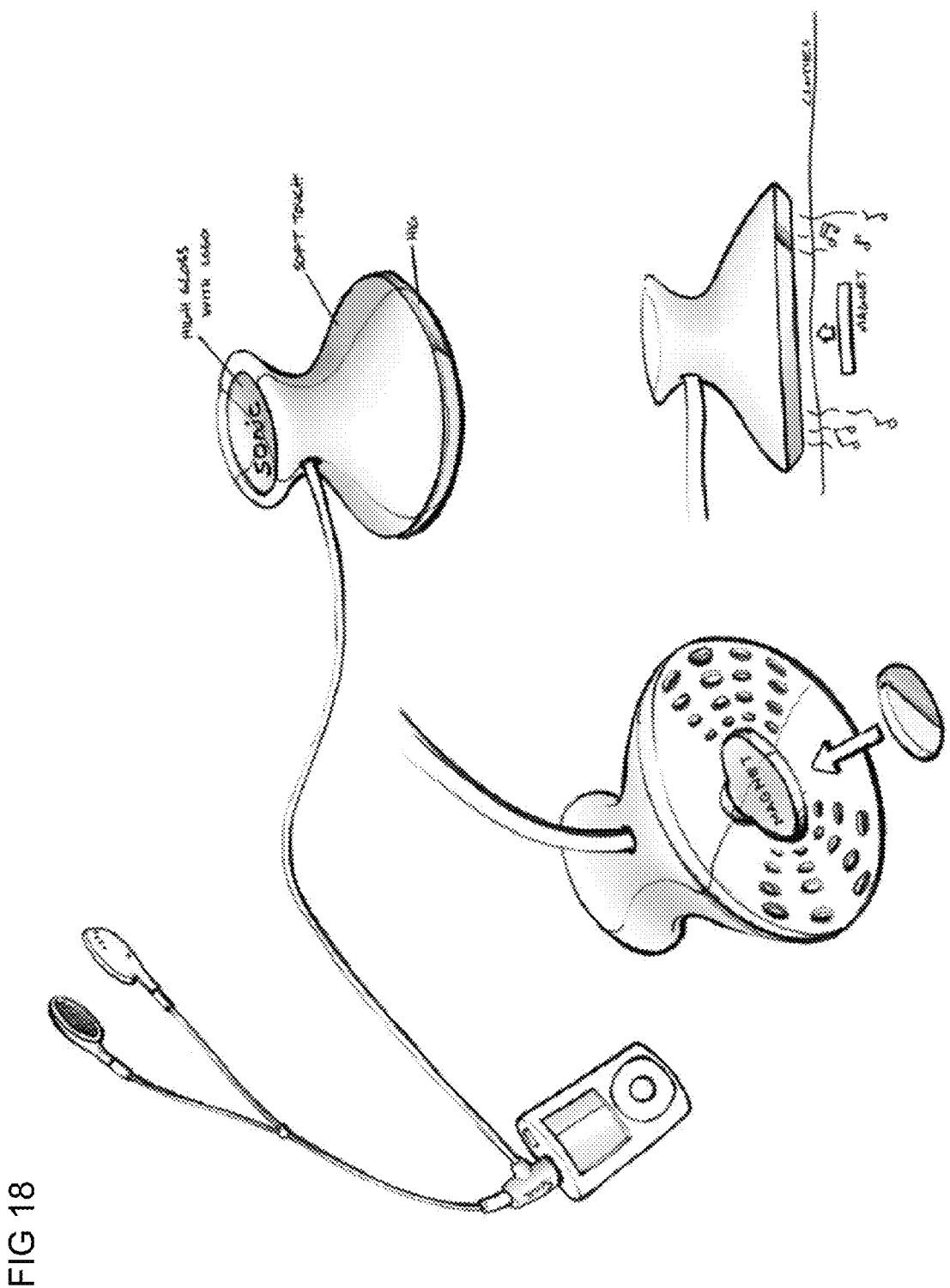

FIG. 18 shows a prenatal sound system having a similar design to that shown in FIG. 16. However, in the system shown in FIG. 17, the plug and ring are held together by means of magnetic attraction.

Figure 19:
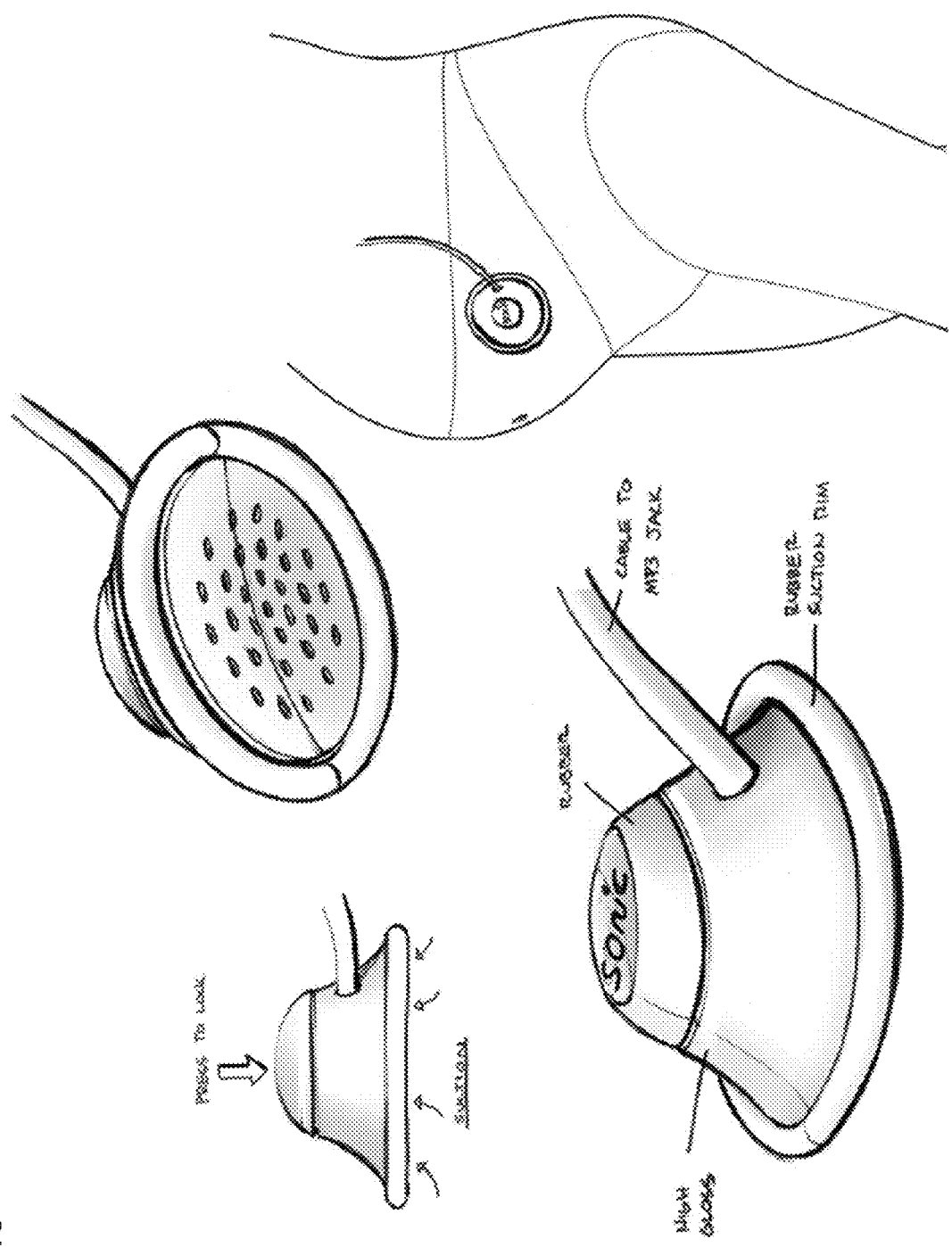

FIG. 19 shows a prenatal sound system having a similar design to that shown in FIG. 16. However, in the system shown in FIG. 18, the audio attenuation device is affixed to the skin by means of suction mechanism.

Figure 20:
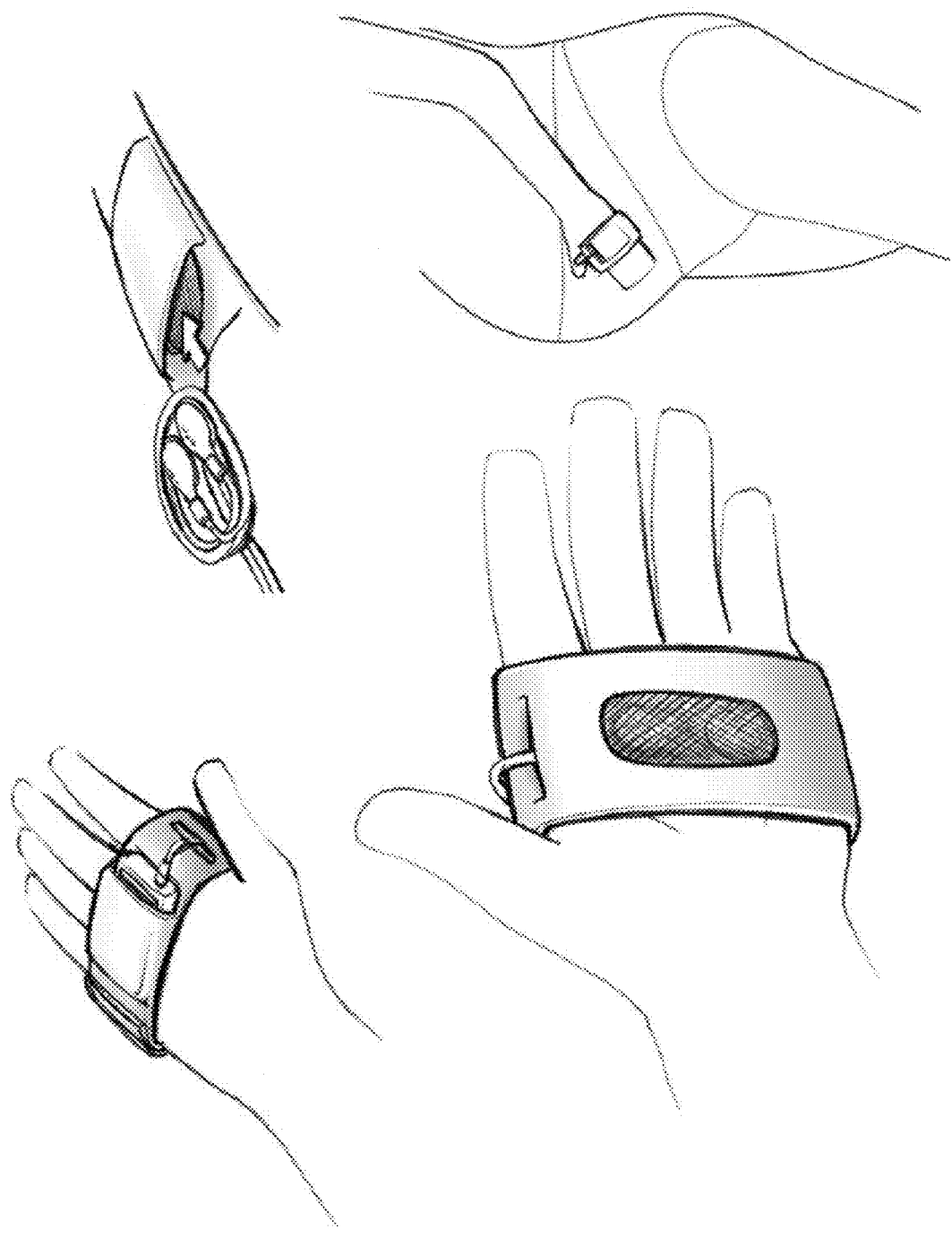

FIG. 20 shows a prenatal sound system in which the audio attenuation device is configured to be held in place on the abdomen by the user's hand. The audio attenuation device consists of a strap, a ring or collar of elasticated material into which the user inserts their hand, a first pocket in which the MP3 player can be stowed, a second pocket in which the earbuds can be stowed facing the abdomen, and a mechanism for providing audio attenuation positioned between the earbuds and the abdomen.

Figure 21:
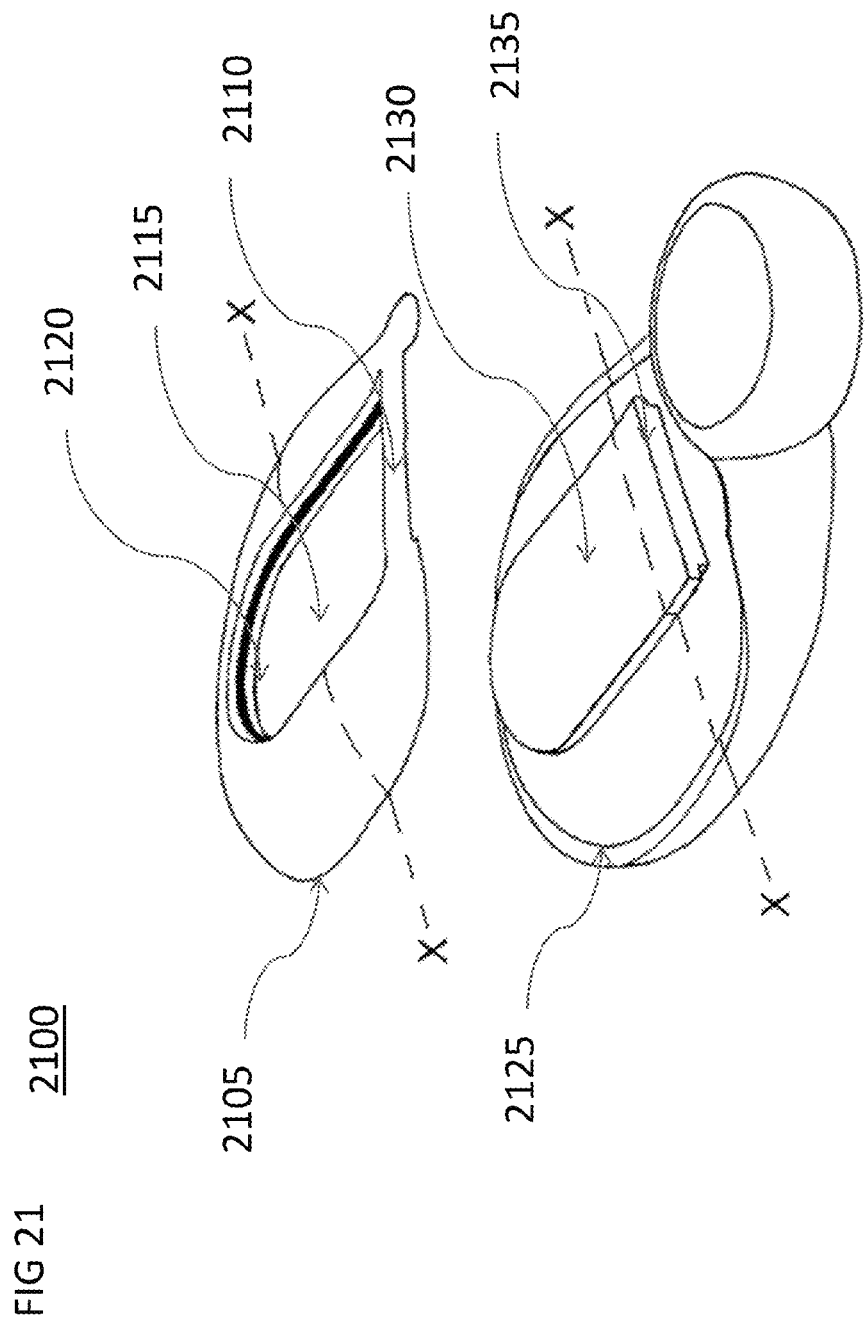
FIG. 21 is a perspective, exploded-view of a two-piece implementation of a swaddle having an integrated front cover and audio attenuating earbud holder.

FIG. 21 shows a three-dimensional exploded-view of a two-piece implementation of a swaddle 2100 that includes an integrated front cover/audio attenuating earbud holder 2125 and a swaddle back cover 2105. The clip for attaching the swaddle back cover 2105 to, for example, a belt or article of clothing has been excluded from the view shown in FIG. 21. In this implementation, the clip is attached to or otherwise integrally formed with the swaddle back cover 2105 at the location marked 2110.

The back cover 2105 defines a hole 2115, which allows for the insertion of a raised part 2130 of the integrated front cover/earbud holder 2125. The profile of the raised part 2130 of the front cover/earbud-holder 2125 matches that of the hole 2115 in the swaddle back cover 2105 to ensure a tight fit between the two. The edge of the raised part of the front cover/earbud holder 2125 includes an under-cut 2135, the profile of which is matched by that of a ridge 2120 on the edge of the hole 2115 in the swaddle back cover 2105. The choice of materials, their physical properties (e.g. hardness), and dimensional tolerances of the swaddle back cover 2105 and the front cover/audio attenuating earbud holder 2125 ensure that there is a tight "push-fit" between the two components. In one implementation, the swaddle back cover 2105 is made of ABS and the front cover/audio-attenuating earbud holder 2125, is made of silicone rubber. The tightness of the fit between the two components is specified in such a way as to enable the individual assembling the swaddle 2100 to (i) easily snap the two components together (ii) hold the two components firmly together.

Figure 22:
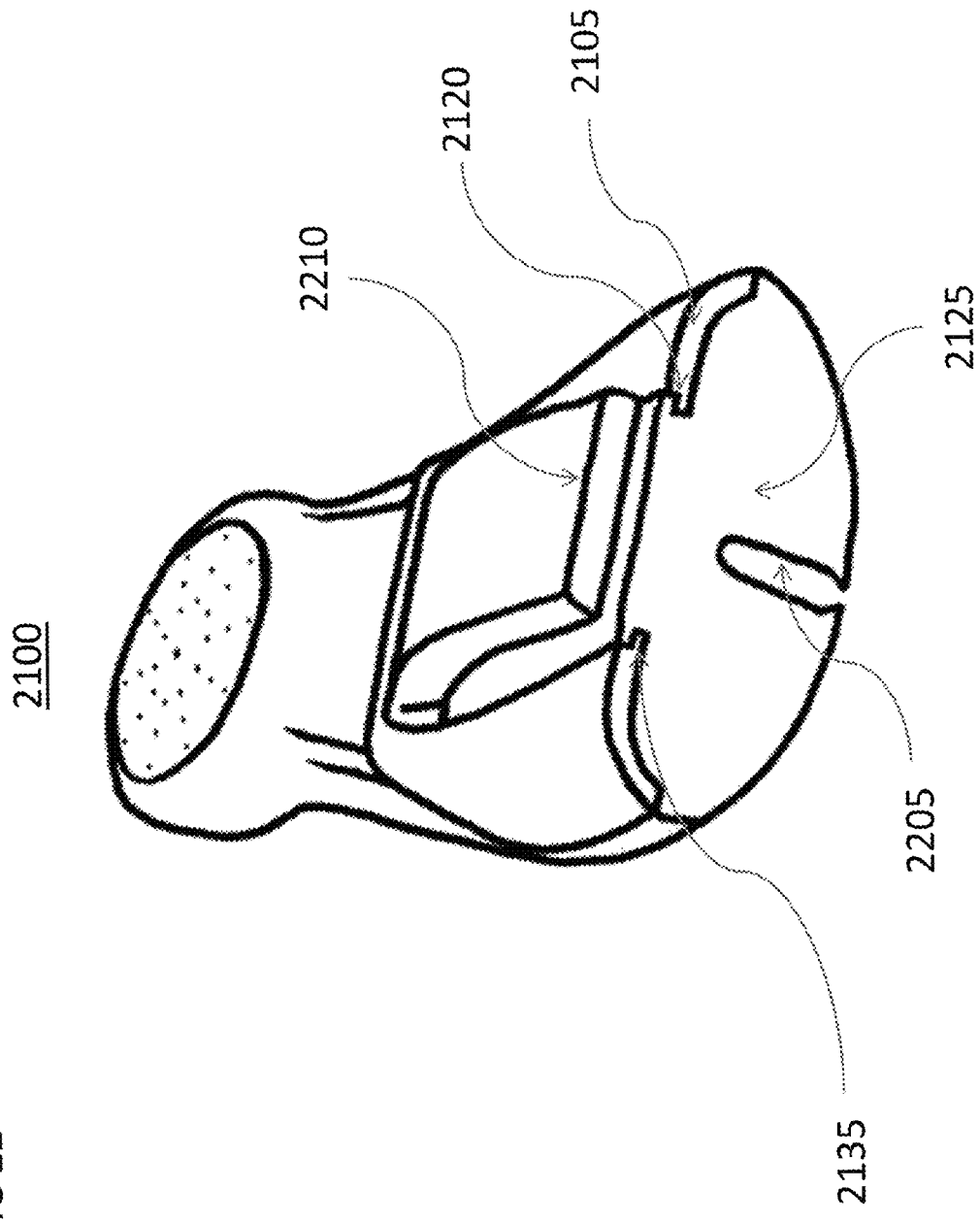
FIG. 22 is a perspective view of the swaddle of FIG. 21.

FIG. 22 is a three-dimensional view of the same two-piece implementation of the swaddle 2100 shown in FIG. 21, showing a cross-section through the swaddle 2100 when the back cover 2105 and the integrated front cover/audio attenuating earbud holder 2125 are snapped or otherwise held firmly together. The location of the cross-section depicted in FIG. 22 is shown in FIG. 21 by the dashed lines marked "X." The FIG. 22 view shows the cross-section of the integrated front cover/earbud holder 2125 including a channel 2205 to conceal and/or hold the earbud wire (not shown) in place, and the profile of the raised part including the undercut 2135. It also shows a cross-section of the swaddle back cover 2105 including the profile of the edge 2120 of the hole 2115. Notably, FIG. 22 further shows a cross-section of a clip 2210 that was omitted from the view of the swaddle 2100 shown in FIG. 21.

Figure 23:
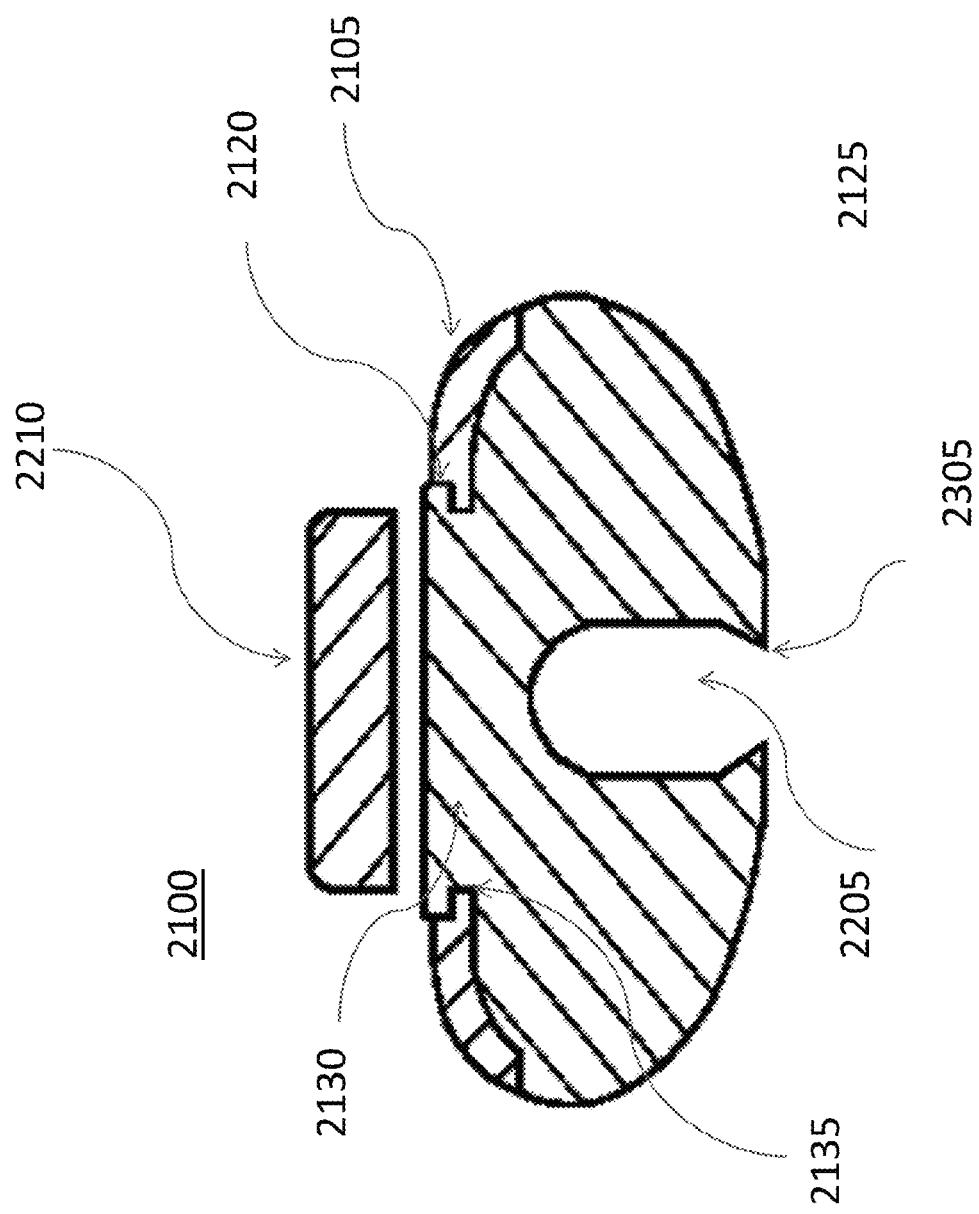
FIG. 23 is a cross-sectional view of the swaddle of FIG. 21.

FIG. 23 is a two-dimensional view of the same cross-section shown in FIG. 22 of the two-piece implementation of the swaddle 2100. As shown in FIG. 23, the cross-section of the integrated front cover/earbud holder 2125 includes the channel 2205 for concealing an earbud wire and the profile of the raised part 2130 includes the undercut 2135. The channel 2205 includes a mechanism to secure the earbud wire in the channel (i.e., to prevent the earbud wire from easily falling out of the channel). In the implementation shown in FIGS. 21-23, the channel 2205 includes resilient ridges 2305 that elastically or temporarily deform to enable the earbud wire to be placed into the channel 2205 and then snap back or otherwise return to their undeformed configuration to secure the earbud wire within the channel 2205. FIG. 23 also shows a cross-section of the swaddle back cover 2105 showing the profile of the edge of the hole 2120 and the cross-section of the clip 2210.

Notably, in any of the implementations described above, the earbud used by the mother to listen to the same audio/music provided to the unborn baby could instead be used by the father or by another user to listen to the same audio/music provided to the unborn baby. In some implementations, additional earbuds or other sound emitting devices may be included in the prenatal sound system to enable multiple different users to listen to the same audio/music provided to the unborn baby.

Accordingly, other implementations are within the scope of the following claims.

What is claimed is:

1. An audio attenuation device for attenuating audio for transmission to an unborn baby, the device including:
a body configured to receive at least one audio earbud, the audio earbud including an audio producing side from which an audio signal is transmitted from the earbud and the body including a portion configured to be positioned in contact with the audio producing side to receive the audio signal from the earbud and to attenuate an intensity of the audio signal by at least 30 decibels; and an attachment mechanism connected to the body and configured to attach the body to an article of clothing of an expectant mother such that the portion is positioned against an abdomen of the expectant mother.

2. The device of claim 1, wherein the attachment mechanism comprises a clip configured to be attached to a belt, waistband, or a bra.

3. The device of claim 1, wherein the portion comprises silicone rubber.

4. The device of claim 1, wherein the attachment mechanism is configured to attach the body to the article of clothing such that the portion is in direct contact with the abdomen of the expectant mother.

5. The device of claim 1, wherein the portion is configured such that, when the audio signal that is received by the portion has a maximum sound level of approximately 115 decibels, the attenuated audio signal exiting the portion has a maximum sound level of 85 decibels.

6. The device of claim 1, wherein the attachment mechanism is connected to the body using a snap-fit connection.

7. The device of claim 6, wherein the snap-fit connection occurs as a result of a ridge being snapped into an undercut.

8. The device of claim 6, wherein the body comprises silicone rubber and the attachment mechanism comprises ABS.

9. An assembly that includes the device of claim 1 and the at least one audio earbud, wherein the at least one audio earbud is positioned within the body.

10. A method of attenuating audio for transmission to an unborn baby, the method including:

inserting an audio earbud into a body, the audio earbud including an audio producing side from which an audio signal is transmitted from the earbud and the body including a portion configured to be positioned in contact with the audio producing side to receive the audio signal from the earbud and to attenuate an intensity of the audio signal, wherein the portion is configured such that, when the audio signal that is received by the portion has a maximum sound level of approximately 90 decibels or greater, the attenuated audio signal exiting the portion has a maximum sound level between approximately 45 and 85 decibels;

using an attachment mechanism connected to the body to attach the body to an article of clothing of an expectant mother such that the portion is positioned against an abdomen of an expectant mother.

11. The method of claim 10, wherein using the attachment mechanism to attach the body to the article of clothing comprises using a clip connected to the body to attach the body to a belt, a waistband, or a bra of the expectant mother.

12. The method of claim 10, wherein the portion comprises silicone rubber.

13. The method of claim 10, wherein using the attachment mechanism connected to the body comprises using the attachment mechanism to attach the body to the article of clothing such that the portion is in direct contact with the abdomen of the expectant mother.

14. The method of claim 10, wherein the portion is configured such that, when the audio signal that is received by the portion has a maximum sound level of approximately 115 decibels, the attenuated audio signal exiting the portion has a maximum sound level between approximately 45 and 85 decibels.

15. The method of claim 10, further comprising connecting the attachment mechanism to the body using a snap-fit connection.

16. The method of claim 10, wherein the portion of the body is configured to attenuate the intensity of the audio signal by at least 30 decibels.

17. An audio attenuation device for attenuating audio for transmission to an unborn baby, the device including:

a body configured to receive at least one audio earbud, the body being formed of a flexible and conformable material having a shape memory that is configured to snugly hold the earbud in place by conforming to a shape of the earbud, the earbud including an audio producing side from which an audio signal is transmitted from the earbud and the body including a portion configured to be positioned in contact with the audio producing side to receive the audio signal from the earbud and to attenuate an intensity of the audio signal, wherein the portion is configured such that, when the audio signal that is received by the portion has a maximum sound level of approximately 90 decibels or greater, the attenuated audio signal exiting the portion has a maximum sound level between approximately 45 and 85 decibels; and an attachment mechanism connected to the body and configured to attach the body to an article of clothing of an expectant mother such that the portion is positioned against an abdomen of the expectant mother.

18. The device of claim 17, wherein the body defines a circular earbud head cavity, and
wherein the body is configured to flexibly retract to enable a user to push a head of the audio earbud into the earbud head cavity and to thereafter snap back to a previous shape to conform tightly around the audio earbud head.

19. An assembly including:

at least one audio earbud;

an audio player that provides electronic signals that are received by the at least one audio earbud and that cause the at least one audio earbud to produce an audio signal having a maximum sound level that is greater than 90 decibels;

a body in which is positioned the at least one audio earbud, the audio earbud including an audio producing side from which the audio signal is transmitted from the earbud and the body including a portion configured to be positioned in contact with the audio producing side to receive the audio signal from the earbud and to attenuate an intensity of the received audio signal such that the attenuated audio signal exiting the portion has a maximum sound level between approximately 45 and 85 decibels; and an attachment mechanism connected to the body and configured to attach the body to an article of clothing of an expectant mother such that the portion is positioned against an abdomen of the expectant mother.

20. The assembly of claim 19, wherein the audio player provides electronic signals to the at least one audio earbud that cause the at least one earbud to produce an audio signal having a maximum sound level of approximately 115 decibels.

* * * * *